(12) United States Patent
Kim

(10) Patent No.: US 11,855,172 B2
(45) Date of Patent: *Dec. 26, 2023

(54) SEMICONDUCTOR DEVICE AND METHOD FOR FABRICATING THE SAME

(71) Applicant: SK hynix Inc., Gyeonggi-do (KR)

(72) Inventor: Beom-Yong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/741,204

(22) Filed: May 10, 2022

(65) Prior Publication Data

US 2022/0271143 A1   Aug. 25, 2022

Related U.S. Application Data

(63) Continuation of application No. 16/780,637, filed on Feb. 3, 2020, now Pat. No. 11,342,437, which is a
(Continued)

(30) Foreign Application Priority Data

Jul. 13, 2018   (KR) .................. 10-2018-0081861

(51) Int. Cl.
*H01L 29/51* (2006.01)
*H01L 29/49* (2006.01)
*H01L 29/06* (2006.01)
*H01L 29/94* (2006.01)
*H01L 21/28* (2006.01)
(Continued)

(52) U.S. Cl.
CPC ...... *H01L 29/517* (2013.01); *H01L 21/28088* (2013.01); *H01L 28/60* (2013.01); *H01L 29/0607* (2013.01); *H01L 29/4966* (2013.01); *H01L 29/94* (2013.01); *H10B 12/30* (2023.02)

(58) Field of Classification Search
CPC . H01L 29/517; H01L 21/28088; H01L 28/60; H01L 29/0607; H01L 29/4966; H01L 29/94; H10B 12/30
See application file for complete search history.

(56) References Cited

U.S. PATENT DOCUMENTS 6,207,561 B1   3/2001   Hwang et al.
2008/0122044 A1   5/2008   Kang et al.
(Continued)

FOREIGN PATENT DOCUMENTS

CN   102858691 A   1/2013
KR   10-2016-0032559 A   3/2016
KR   10-2017-0122346 A   11/2017

OTHER PUBLICATIONS

Office Action for the Chinese Patent Application No. 201910338648.2 issued by the Chinese Patent Office dated Feb. 2, 2023.
(Continued)

*Primary Examiner* — Samuel A Gebremariam
(74) *Attorney, Agent, or Firm* — IP & T GROUP LLP

(57) ABSTRACT

A semiconductor layer stack includes a first conductive layer, a dielectric layer including a high-k material, which is formed on the first conductive layer, a second conductive layer formed on the dielectric layer, and an interface control layer formed between the dielectric layer and the second conductive layer and including a leakage blocking material, a dopant material, a high bandgap material and a high work function material.

10 Claims, 29 Drawing Sheets

Related U.S. Application Data continuation of application No. 16/233,582, filed on Dec. 27, 2018, now Pat. No. 10,593,777.

(51) Int. Cl.
    *H01L 49/02*     (2006.01)
    *H10B 12/00*     (2023.01)

(56) References Cited

U.S. PATENT DOCUMENTS

| | | |
|---|---|---|
| 2012/0287553 A1 | 11/2012 | Ramani et al. |
| 2012/0320494 A1 | 12/2012 | Krishnan et al. |
| 2015/0228710 A1 | 8/2015 | Rui et al. |
| 2016/0079247 A1 | 3/2016 | Lim et al. |

OTHER PUBLICATIONS

Jong-Chang Woo et al., Low leakage current in metal-insulator-metal capacitors of structural Al2O3/TiO2/Al2O3 dielectrics, Applied Physics Letters, Feb. 21, 2012, pp. 081101-1-081101-3, vol. 100, American Institute of Physics.

Office Action for the Korean Patent Application No. 10-2018-0081861 issued by the Korean Intellectual Property Office dated Jun. 15, 2023.

SEMICONDUCTOR DEVICE AND METHOD FOR FABRICATING THE SAME

CROSS-REFERENCE TO RELATED APPLICATIONS

This application is a continuation of U.S. patent application Ser. No. 16/780,637, filed on Feb. 3, 2020, which is a continuation of U.S. patent application Ser. No. 16/233,582, filed on Dec. 27, 2018, and issued as U.S. Pat. No. 10,593,777 on Mar. 17, 2020, which claims benefits of priority of Korean Patent Application No. 10-2018-0081861 filed on Jul. 13, 2018. The disclosure of each of the foregoing application is incorporated herein by reference in its entirety.

BACKGROUND

1. Field

Exemplary embodiments relate to a semiconductor device and, more particularly, to a semiconductor device including an interface control layer and a method for fabricating the same.

2. Description of the Related Art

A capacitor of a semiconductor device may include a bottom electrode, a dielectric layer, and a top electrode. As the degree of integration of a semiconductor device increases, the thickness of the dielectric layer decreases which may result in increased leakage current. Increasing the thickness of the dielectric layer to reduce the leakage current leads to an increase in the equivalent oxide layer thickness (EOT).

SUMMARY

Exemplary embodiments are directed to a semiconductor layer stack that may improve leakage, and a method for fabricating the semiconductor layer stack.

Exemplary embodiments are directed to a capacitor that may prevent a reduction of a dielectric layer, and a method for fabricating the capacitor.

Exemplary embodiments are directed to a capacitor that may increase a dielectric constant of a dielectric layer, and a method for fabricating the capacitor.

In accordance with an embodiment, a semiconductor layer stack may include: a first conductive layer; a dielectric layer including a high-k material, which is formed on the first conductive layer; a second conductive layer formed on the dielectric layer; and an interface control layer formed between the dielectric layer and the second conductive layer, and including a leakage blocking material, a dopant material and a high bandgap material. The interface control layer may further include a high work function material formed between the high bandgap material and the second conductive layer.

In accordance with an embodiment, a capacitor may include: a bottom electrode; a dielectric layer formed on the bottom electrode, and including an intermixed compound in which two or more high-k materials are mixed; a top electrode formed on the dielectric layer; and an interface control layer formed between the dielectric layer and the top electrode, and including a reduction preventing material and a high work function material that is sequentially stacked one on the other. The intermixed compound may include a first high-k material and a second high-k material having a higher dielectric constant than the first high-k material. The intermixed compound may include a compound of a titanium oxide and a zirconium oxide. The intermixed compound may include a compound of an aluminum oxide and a zirconium oxide, and further may include a dopant material of a titanium oxide. The high work function material may include a high work function compound in which the reduction preventing material and the top electrode are intermixed, and the high work function compound may include a conductive material having a higher work function than the top electrode. The reduction preventing material may include a high bandgap material having a higher bandgap than a zirconium oxide and a hafnium oxide. The reduction preventing material may include an aluminum oxide or a silicon oxide. The top electrode may include a titanium nitride, the reduction preventing material may include an aluminum oxide, and the high work function material may include a titanium aluminum nitride. The top electrode may include a titanium nitride, the reduction preventing material may include a silicon oxide, and the high work function material may include a titanium silicon nitride. The dielectric layer further may include a high-k material layer formed between the intermixed compound and the bottom electrode and having a lower dielectric constant than the intermixed compound.

In accordance with an embodiment, a capacitor may include: a bottom electrode; a dielectric layer formed on the bottom electrode, and including a high-k material; a top electrode formed on the dielectric layer; and an interface control layer formed between the dielectric layer and the top electrode, and including a dopant-containing layer, a high bandgap layer and a high work function layer that are sequentially stacked on top of one another. The high bandgap layer is thinner than the dopant-containing layer. The dopant-containing layer may include a material having a higher dielectric constant than the high bandgap layer and the high-k material. The high bandgap layer may include a material having a higher bandgap than the dopant-containing layer. The high work function layer may include a conductive material having a higher work function than the top electrode. The high bandgap layer may include an aluminum oxide or a silicon oxide. The high work function layer may include a titanium aluminum nitride or a titanium silicon nitride. The dopant-containing layer may include a titanium oxide. The high-k material of the dielectric layer may include a zirconium oxide-based layer or a hafnium oxide-based layer.

In accordance with an embodiment, a memory cell may include: a semiconductor substrate including a first impurity region, a second impurity region, and a word line trench formed between the first impurity region and the second impurity region; a buried word line formed in the word line trench; a bit line coupled to the first impurity region; and a capacitor coupled to the second impurity region, wherein the capacitor includes: a bottom electrode; a dielectric layer including a high-k material, which is formed on the bottom electrode; a top electrode formed on the dielectric layer; and an interface control layer formed between the dielectric layer and the top electrode, and including a leakage blocking material, a dopant material, a high bandgap material and a high work function material that are sequentially stacked on top of one another. The high work function material may include a conductive material having a higher work function than the top electrode. the high bandgap material includes a material having a higher bandgap than the dopant material. Each of the leakage blocking material and the high bandgap material is thinner than the dopant material. The dopant material may include a material having a higher dielectric constant than the high-k material, the leakage blocking material and the high bandgap material. Each of the leakage blocking material and the high bandgap material may include an aluminum oxide or a silicon oxide. The dopant material may include a titanium oxide. The high work function material may include a titanium aluminum nitride or a titanium silicon nitride. A dielectric layer, leakage blocking material, dopant material and high bandgap material stack in which the dielectric layer, the leakage blocking material, the dopant material and the high bandgap material are sequentially stacked may include a ZAZATA ($ZrO_2/Al_2O_3/ZrO_2/Al_2O_3/TiO_2/Al_2O_3$) stack, a ZAZATS ($ZrO_2/Al_2O_3/ZrO_2/Al_2O_3/TiO_2/SiO_2$) stack, an HAHATA ($HfO_2/Al_2O_3/HfO_2/Al_2O_3/TiO_2/Al_2O_3$) stack, an HAHATS ($HfO_2/Al_2O_3/HfO_2/Al_2O_3/TiO_2/SiO_2$) stack or an HSHSTS ($HfO_2/SiO_2/HfO_2/SiO_2/TiO_2/SiO_2$) stack.

In accordance with an embodiment, a method for fabricating a capacitor may include: forming a bottom electrode; forming a dielectric layer on the bottom electrode; forming a leakage blocking layer on the dielectric layer; forming a dopant-containing layer on the leakage blocking layer; forming a reduction preventing layer on the dopant-containing layer; forming a high work function layer on the reduction preventing layer; and forming a top electrode on the high work function layer. Each of the reduction preventing layer and the leakage blocking layer may include a material having a higher bandgap than the dopant-containing layer. Each of the reduction preventing layer and the leakage blocking layer may include an aluminum oxide or a silicon oxide. The dopant-containing layer may include a material having a higher dielectric constant than the reduction preventing layer. The dopant-containing layer may include a material that is thermally diffused into the leakage blocking layer and the dielectric layer. The dopant-containing layer may include a titanium oxide. A leakage blocking layer, dopant-containing layer and reduction preventing layer stack in which the leakage blocking layer, the dopant-containing layer and the reduction preventing layer are sequentially stacked includes an ATA ($Al_2O_3/TiO_2/Al_2O_3$) stack, an STS ($SiO_2/TiO_2/SiO_2$) stack or an ATS ($Al_2O_3/TiO_2/SiO_2$) stack. The dielectric layer may include an ZAZ ($ZrO_2/Al_2O_3/ZrO_2$) stack, an HAH ($HfO_2/Al_2O_3/HfO_2$) stack or an HSH ($HfO_2/SiO_2/HfO_2$) stack. The forming of the top electrode may include depositing a titanium nitride by Atomic Layer Deposition (ALD). The forming of the high work function layer may include depositing a titanium nitride by Atomic Layer Deposition (ALD) using a titanium-source material and a nitrogen-source material and forming an intermixed compound of a surface of the reduction preventing layer and the titanium nitride. The intermixed compound has a higher work function than the titanium nitride. The reduction preventing layer may include an aluminum oxide, and the intermixed compound includes a titanium aluminum nitride. The method may further include performing a thermal process after the forming of the dopant-containing layer, wherein, by the thermal process, an intermixed compound having a high dielectric constant, in which the dopant-containing layer, the leakage blocking layer and a portion of the dielectric layer in contact with the leakage blocking layer are intermixed, is formed. The intermixed compound having the high dielectric constant has a higher dielectric constant than the dielectric layer. The intermixed compound having the high dielectric constant includes a compound of a zirconium oxide and an aluminum oxide, and further includes a dopant of a titanium oxide.

These and other features and advantages of the present invention will become apparent to those skilled in the art of the invention from the following detailed description in conjunction with the following drawings.

DETAILED DESCRIPTION

Figure 1:
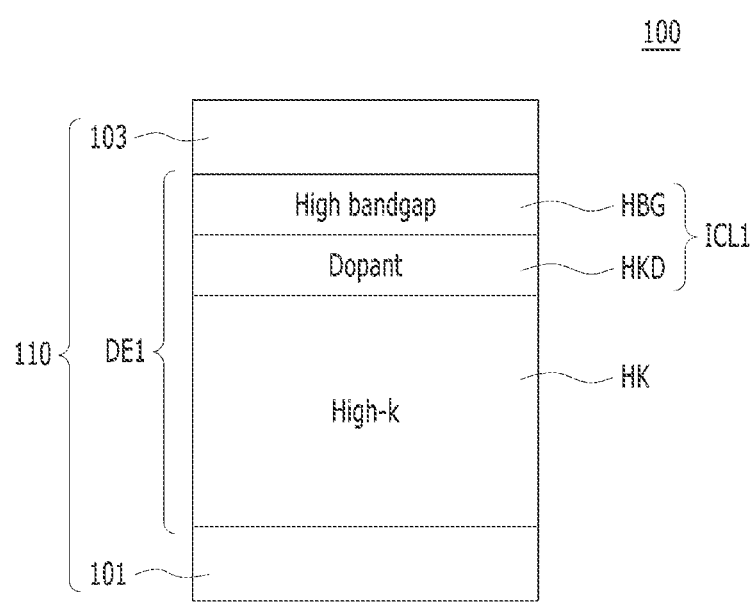
FIG. 1 is a cross-sectional view of a semiconductor device in accordance with an embodiment.

Various examples and implementations of the disclosed technology are described below in detail with reference to the accompanying drawings.

The drawings may not necessarily be to scale and in some instances, proportions of structures in the drawings may have been exaggerated to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. Throughout the disclosure, like reference numerals refer to like parts in the various figures and embodiments.

In addition, a described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exist or are added.

A capacitor may include a bottom electrode, a dielectric layer, and a top electrode. As the thickness of the dielectric layer decreases, the leakage current may increase. A dielectric constant and an energy band gap (hereinafter abbreviated as a "bandgap") of the dielectric layer are inversely proportional to each other. In order to suppress the leakage current, the thickness of the dielectric layer may be increased or a dielectric layer having a low dielectric constant may be used. An increase in the thickness of the dielectric layer and the low dielectric constant of the dielectric layer may increase the electrical thickness of the dielectric layer, that is, the equivalent oxide layer thickness (EOT). When the thickness of the dielectric layer is reduced to reduce the equivalent oxide layer thickness, the reduced thickness of the dielectric layer becomes smaller than the minimum thickness necessary for crystallization of the dielectric layer, thereby increasing the amorphous characteristic. Therefore, although the thickness of the dielectric layer is reduced, there is limitation in an increase of the capacitance.

In addition, the top electrode of the capacitor may be formed in a strong reducing atmosphere. For example, the strong reducing atmosphere may include gases such as $NH_3$, $SiH_x$, $GeH_x$ and $BH_x$. Since the strong reducing atmosphere causes a loss of oxygen in the dielectric layer, the quality of the dielectric layer may be lowered.

Hereinafter, embodiments are directed to a dielectric layer stack and interfacial engineering that may prevent the reduction of the dielectric layer. In addition, embodiments are directed to a dielectric layer stack and interfacial engineering that may increase the dielectric constant of the dielectric layer. Furthermore, embodiments are directed to a dielectric layer stack and interfacial engineering that may reduce leakage.

FIG. 1 is a cross-sectional view of a semiconductor device 100 in accordance with an embodiment.

Referring to FIG. 1, the semiconductor device 100 may include a semiconductor layer stack 110. The semiconductor layer stack 110 may include a first conductive layer 101, a dielectric layer stack DE1, and a second conductive layer 103. The dielectric layer stack DE1 may include a dielectric layer HK and an interface control layer ICL1. The interface control layer ICL1 may be formed between the dielectric layer HK and the second conductive layer 103.

The first conductive layer 101 may include a metal-containing material. The first conductive layer 101 may include a metal, a metal nitride, a conductive metal oxide or a combination thereof. The first conductive layer 101 may include titanium (Ti), a titanium nitride (TiN), a tantalum nitride (TaN), tungsten (W), a tungsten nitride (WN), ruthenium (Ru), iridium (Ir), a ruthenium oxide, an iridium oxide or any combinations thereof. In some embodiments, the first conductive layer 101 may include a silicon-containing material. For example, the first conductive layer 101 may include a silicon (Si) substrate, a silicon layer, a silicon germanium (SiGe) layer or any combinations thereof.

The second conductive layer 103 may include a silicon-containing material, a germanium-containing material, a metal-containing material or any combinations thereof. The second conductive layer 103 may include a metal, a metal nitride, a conductive metal nitride or any combinations thereof. The second conductive layer 103 may include titanium (Ti), a titanium nitride (TiN), a tantalum nitride (TaN), tungsten (W), a tungsten nitride (WN), ruthenium (Ru), iridium (Ir), a ruthenium oxide, an iridium oxide or any combinations thereof. The second conductive layer 103 may include a silicon (Si) layer, a germanium (Ge) layer, a silicon germanium (SiGe) layer or any combinations thereof. The second conductive layer 103 may have a multi-layer structure (Si/SiGe) formed by stacking the silicon germanium layer on the silicon layer. The second conductive layer 103 may have a multi-layer structure (Ge/SiGe) formed by stacking the silicon germanium layer on the germanium layer. The second conductive layer 103 may be formed by stacking the silicon germanium layer and the metal nitride. For example, the second conductive layer 103 may have a multi-layer structure (SiGe/TiN) formed by stacking the titanium nitride on the silicon germanium layer.

The dielectric layer stack DE1 may be formed by Atomic Layer Deposition (ALD).

The dielectric layer HK may be formed in a single layer, a multi-layer or a laminate structure. The dielectric layer HK may be coupled to the first conductive layer 101. The dielectric layer HK may include a high-k material. The dielectric layer HK may have a dielectric constant that is higher than the dielectric constant of a silicon oxide ($SiO_2$). The dielectric constant of the silicon oxide may be approximately 3.9, and the dielectric layer HK may include a material having a dielectric constant of approximately 4 or higher. The high-k material may have a dielectric constant of approximately or higher. The high-k material may include a hafnium oxide ($HfO_2$), a zirconium oxide ($ZrO_2$), an aluminum oxide ($Al_2O_3$), a titanium oxide ($TiO_2$), a tantalum oxide ($Ta_2O_5$), a niobium oxide ($Nb_2O_5$) or a strontium titanium oxide ($SrTiO_3$). In some embodiments, the dielectric layer HK may be a composite layer including two or more layers made of the above-described high-k material. The dielectric layer HK may be formed of a zirconium (Zr)-based oxide. The dielectric layer HK may be formed in a multi-layer structure including a zirconium oxide ($ZrO_2$). The dielectric layer HK may include a ZAZ ($ZrO_2/Al_2O_3/$ $ZrO_2$) structure in which a zirconium oxide, an aluminum oxide and a zirconium oxide are sequentially stacked. The ZAZ structure may be referred to as a zirconium oxide ($ZrO_2$)-based layer. In some embodiments, the dielectric layer HK may be formed of a hafnium (Hf)-based oxide. The dielectric layer HK may be formed in a multi-layer structure including a hafnium oxide ($HfO_2$). For example, the dielectric layer HK may include an HAH ($HfO_2/Al_2O_3/HfO_2$) structure in which a hafnium oxide, an aluminum oxide and a hafnium oxide are sequentially stacked. The HAH structure may be referred to as a hafnium oxide ($HfO_2$)-based layer. In some embodiments, the dielectric layer HK may include a $TiO_2/ZAZ$, a $TiO_2/HAH$, a $Ta_2O_5/ZAZ$ or a $Ta_2O_5/HAH$ structure. The $TiO_2/ZAZ$ and the $Ta_2O_5/ZAZ$ structures may be formed by stacking a ZAZ ($ZrO_2/Al_2O_3/ZrO_2$) on a titanium oxide ($TiO_2$) and a tantalum oxide ($Ta_2O_5$), respectively. The $TiO_2/HAH$ and the $Ta_2O_5/HAH$ structures may be formed by stacking a HAH ($HfO_2/Al_2O_3/HfO_2$) on a titanium oxide ($TiO_2$) and a tantalum oxide ($Ta_2O_5$), respectively.

The aluminum oxide $Al_2O_3$ of the ZAZ ($ZrO_2/Al_2O_3/ZrO_2$) and the HAH ($HfO_2/Al_2O_3/HfO_2$) structure may have a higher bandgap than the zirconium oxide ($ZrO_2$) and the hafnium oxide ($HfO_2$). The aluminum oxide $Al_2O_3$ may have a dielectric constant that is lower than the dielectric constants of the zirconium oxide ($ZrO_2$) and the hafnium oxide ($HfO_2$). Accordingly, the dielectric layer HK may include a stack of a high-k material and a high bandgap material having a higher bandgap than the high-k material. The dielectric layer HK may include a silicon oxide $SiO_2$ employed as a high bandgap material instead of an aluminum oxide, which is to be described below. The dielectric layer HK including a high bandgap material may suppress leakage.

In some embodiments, the dielectric layer HK may include a laminate structure such as a ZAZAZ ($ZrO_2/Al_2O_3/ZrO_2/Al_2O_3/ZrO_2$) and an HAHAH ($HfO_2/Al_2O_3/HfO_2/Al_2O_3/HfO_2$).

The interface control layer ICL1 may include a dopant-containing layer HKD and a high bandgap layer HBG. The high bandgap layer HBG may be in direct contact with the second conductive layer 103. The dopant-containing layer HKD may be in direct contact with a top surface of the dielectric layer HK.

The dopant-containing layer HKD may contain a dopant. The dopant may include a material that is thermally diffusible. The dopant may diffuse into the dielectric layer HK to increase the dielectric constant of the dielectric layer HK. The dopant-containing layer HKD may have a high dielectric constant by including the dopant. The dopant-containing layer HKD may have a higher dielectric constant than the dielectric layer HK. The dopant-containing layer HKD may have a high dielectric constant of approximately 50 or higher. The dopant may include a metal, a metal oxide or any combinations thereof. The dopant-containing layer HKD may contain titanium as the dopant. The dopant-containing layer HKD may include a titanium oxide. The thickness of the dopant-containing layer HKD may be 0.3 nm to 1 nm.

The high bandgap layer HBG may include a material having a high bandgap. The high bandgap layer HBG may have a bandgap of approximately 8 eV or higher. The high bandgap layer HBG may include a reduction preventing material. The high bandgap layer HBG may prevent reduction of the dielectric layer HK and the dopant-containing layer HKD when the second conductive layer 103 is formed. The high bandgap layer HBG may include a material that is not relatively reduced well in comparison with the dielectric layer HK and the dopant-containing layer HKD. The high bandgap layer HBG may include aluminum. The high bandgap layer HBG may include an aluminum oxide. In some embodiments, the high bandgap layer HBG may include a silicon oxide. The aluminum oxide and the silicon oxide have a high band gap of approximately 8 eV or higher and are not easily reduced.

The dielectric layer stack DE1 may be formed by sequentially stacking the dielectric layer HK, the dopant-containing layer HKD and the high bandgap layer HBG. The dopant-containing layer HKD may have a higher dielectric constant than the dielectric layer HK and the high bandgap layer HBG. The dielectric layer HK may have a higher dielectric constant than the high bandgap layer HBG. The high bandgap layer HBG may be thinner than the dopant-containing layer HKD and the dielectric layer HK. The high bandgap layer HBG may be an ultra-thin layer. The thickness of the high bandgap layer HBG may be 0.1 nm to 0.2 nm. The equivalent oxide layer thickness of the dielectric layer stack DE1 may be decreased by the ultra-thin high bandgap layer HBG. The reduction of the dielectric layer HK and the dopant-containing layer HKD may be prevented by the ultra-thin high bandgap layer HBG. The capacitance of the dielectric layer stack DE1 may be increased by the dopant-containing layer HKD.

FIGS. 2A to 2D are cross-sectional views illustrating application examples of the semiconductor device 100 shown in FIG. 1.

Figure 2A:
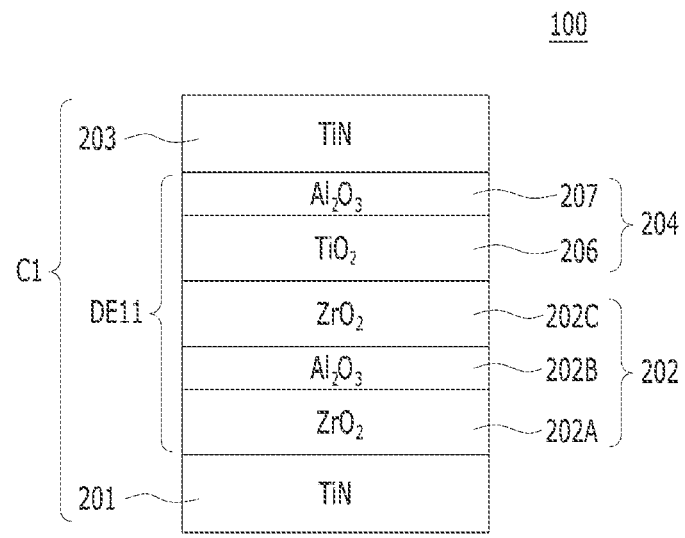
FIGS. 2A to 2D are cross-sectional views illustrating application examples of the semiconductor device shown in FIG. 1.

Referring to FIG. 2A, the semiconductor device 100 may include a capacitor C1. The capacitor C1 may correspond to the semiconductor layer stack 110 shown in FIG. 1.

The capacitor C1 may include a bottom electrode 201, a dielectric layer 202, and a top electrode 203. The capacitor C1 may further include an interface control layer 204 between the dielectric layer 202 and the top electrode 203. The stacked structure of the dielectric layer 202 and the interface control layer 204 may be a dielectric layer stack DE11.

Each of the bottom electrode 201 and the top electrode 203 may include a titanium nitride (TiN). In some embodiments, the bottom electrode 201 and the top electrode 203 may include a silicon-containing material, a germanium-containing material, a conductive metal oxide, a metal nitride, a metal or any combinations thereof.

The dielectric layer 202 may include a zirconium oxide-based layer. The dielectric layer 202 may be formed by sequentially stacking a zirconium oxide 202A, an aluminum oxide 202B and a zirconium oxide 202C. In other words, the dielectric layer 202 may include a ZAZ ($ZrO_2/Al_2O_3/ZrO_2$) structure. The aluminum oxide 202B may be thinner than the zirconium oxides 202A and 202C. The ZAZ ($ZrO_2/Al_2O_3/ZrO_2$) structure may have a high dielectric constant due to the zirconium oxides 202A and 202C, where leakage may be suppressed by the aluminum oxide 202B.

The interface control layer 204 may include a TA ($TiO_2/Al_2O_3$) structure in which a titanium oxide 206 and an aluminum oxide 207 are sequentially stacked. The aluminum oxide 207 may be thinner than the titanium oxide 206. The titanium oxide 206 may correspond to the dopant-containing layer HKD shown in FIG. 1. The aluminum oxide 207 may correspond to the high bandgap layer HBG shown in FIG. 1.

The dielectric layer stack DE11 may be formed of a ZAZTA ($ZrO_2/Al_2O_3/ZrO_2/TiO_2/Al_2O_3$) structure in which the zirconium oxide 202A, the aluminum oxide 202B, the zirconium oxide 202C, the titanium oxide 206 and the aluminum oxide 207 are sequentially stacked. The aluminum oxide 207 may be thinner than the titanium oxide 206. The aluminum oxide 207 may be thinner than the aluminum oxide 202B of the dielectric layer 202. The thickness of the aluminum oxide 207 may be 0.1 nm to 0.2 nm. The thickness of the titanium oxide 206 may be 0.3 nm to 1 nm.

Figure 2B:
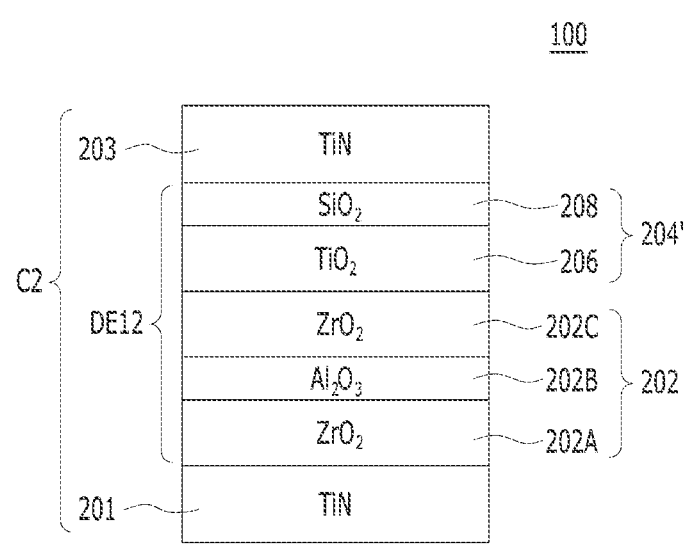

Referring to FIG. 2B, the remaining configurations of a capacitor C2 except for an interface control layer 204' may be the same as those of the capacitor C1 shown in FIG. 2A.

The interface control layer 204' may include a TS (TiO$_2$/SiO$_2$) structure in which a titanium oxide 206 and a silicon oxide 208 are sequentially stacked. The silicon oxide 208 may be thinner than the titanium oxide 206. The titanium oxide 206 may correspond to the dopant-containing layer HKD shown in FIG. 1. The silicon oxide 208 may correspond to the high bandgap layer HBG shown in FIG. 1.

The dielectric layer stack DE12 may be formed of a ZAZTS (ZrO$_2$/Al$_2$O$_3$/ZrO$_2$/TiO$_2$/SiO$_2$) structure in which a zirconium oxide 202A, an aluminum oxide 202B, a zirconium oxide 202C, the titanium oxide 206 and the silicon oxide 208 are sequentially stacked. The silicon oxide 208 may be thinner than the titanium oxide 206. The silicon oxide 208 may be thinner than the aluminum oxide 202B.

Figure 2C:
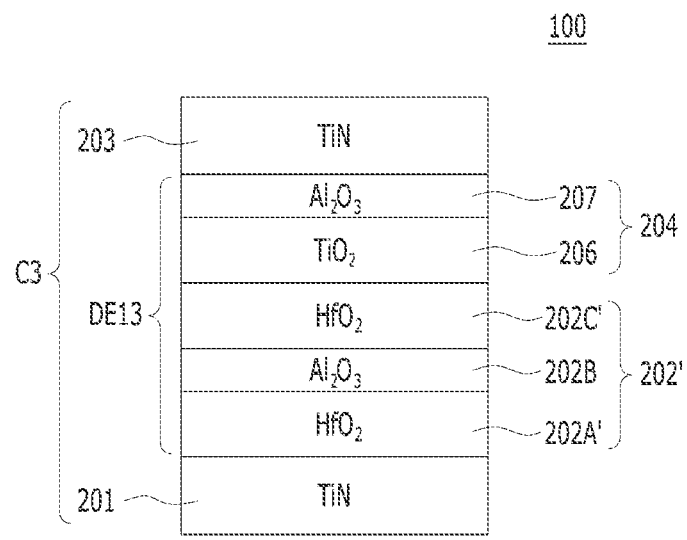

Referring to FIG. 2C, the remaining configurations of a capacitor C3 except for a dielectric layer 202' may be the same as those of the capacitor C1 shown in FIG. 2A.

The dielectric layer 202' may include a hafnium oxide-based layer. The dielectric layer 202' may be formed by sequentially stacking a hafnium oxide 202A', an aluminum oxide 202B and a hafnium oxide 202C'. In other words, the dielectric layer 202' may include an HAH (HfO$_2$/Al$_2$O$_3$/HfO$_2$) structure. The aluminum oxide 202B may be thinner than the hafnium oxides 202A' and 202C'.

A dielectric layer stack DE13 may be formed of a HAHTA (HfO$_2$/Al$_2$O$_3$/HfO$_2$/TiO$_2$/Al$_2$O$_3$) structure in which the hafnium oxide 202A', the aluminum oxide 202B, the hafnium oxide 202C', a titanium oxide 206 and an aluminum oxide 207 are sequentially stacked. The aluminum oxide 207 may be thinner than the titanium oxide 206. The aluminum oxide 207 may be thinner than the aluminum oxide 202B of the dielectric layer 202'.

Figure 2D:
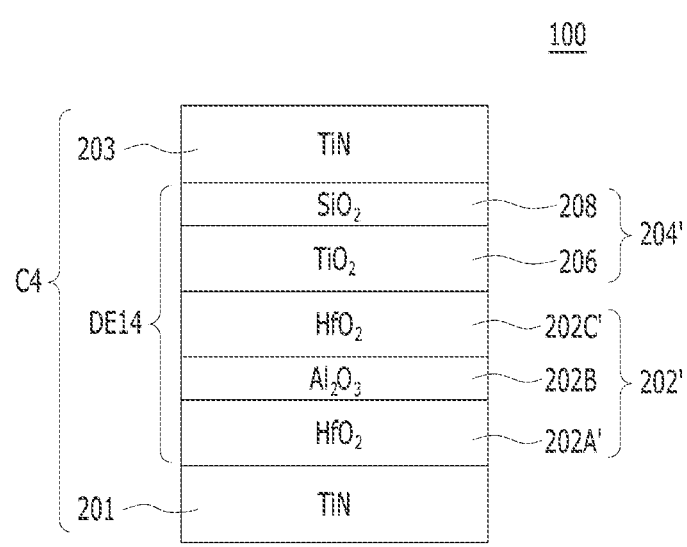

Referring to FIG. 2D, the remaining configurations of a capacitor C4 except for an interface control layer 204' may be the same as those of the capacitor C3 shown in FIG. 2C.

The interface control layer 204' may include a TS (TiO$_2$/SiO$_2$) in which a titanium oxide 206 and a silicon oxide 208 are sequentially stacked. The silicon oxide 208 may be thinner than the titanium oxide 206. The titanium oxide 206 may correspond to the dopant-containing layer HKD shown in FIG. 1. The silicon oxide 208 may correspond to the high bandgap layer HBG shown in FIG. 1.

A dielectric layer stack DE14 may be formed of a HAHTS (HfO$_2$/Al$_2$O$_3$/HfO$_2$/TiO$_2$/SiO$_2$) in which a hafnium oxide 202A', an aluminum oxide 202B, a hafnium oxide 202C', the titanium oxide 206 and the silicon oxide 208 are sequentially stacked. The silicon oxide 208 may be thinner than the titanium oxide 206. The silicon oxide 208 may be thinner than the aluminum oxide 202B.

According to the above-described application examples of the semiconductor device 100, the aluminum oxides 202B and 207 and the silicon oxide 208 may be thin to increase capacitance of the dielectric layer stacks DE11, DE12, DE13 and DE14. The aluminum oxides 202B and 207 and the silicon oxide 208 as materials having lower dielectric constants than the zirconium oxides 202A and 202C, the hafnium oxides 202A' and 202C' and the titanium oxide 206 may suppress a decrease in capacitance by being formed extremely thin. The equivalent oxide layer thicknesses (EOT) of the dielectric layer stacks DE11, DE12, DE13 and DE14 may increase as the thicknesses of the aluminum oxides 202B and 207 and the silicon oxide 208 increase. Therefore, in order to decrease the equivalent oxide layer thicknesses, the thicknesses of the aluminum oxides 202B and 207 and the silicon oxide 208 may be 0.1 nm to 0.2 nm. The aluminum oxide 207 and the silicon oxide 208 of the interface control layers 204 and 204' may be thinner than the aluminum oxide 202B of the dielectric layers 202 and 202'.

Figure 3:
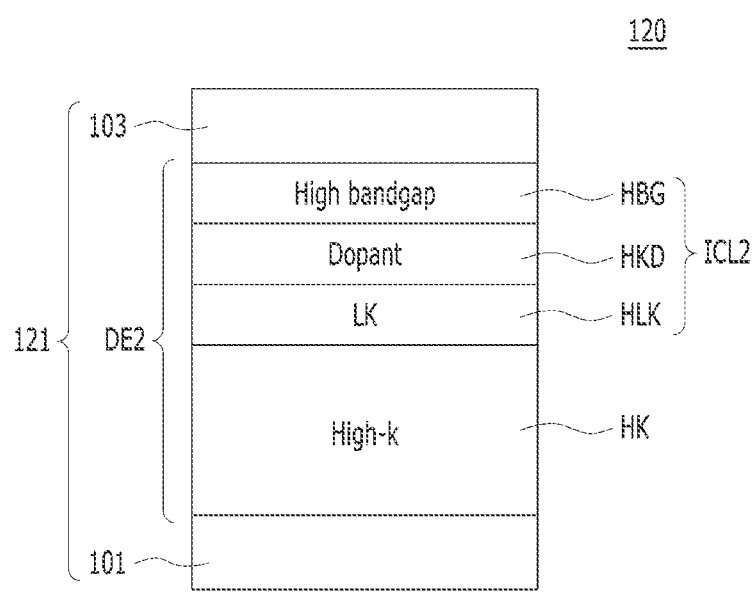
FIG. 3 is a cross-sectional view of a semiconductor device in accordance with an embodiment.

FIG. 3 is a cross-sectional view of a semiconductor device 120 in accordance with an embodiment. Detailed descriptions of the components and configurations of the semiconductor device 120 that are the same as or similar to those of the semiconductor device 100 shown in FIG. 1 are omitted.

Referring to FIG. 3, the semiconductor device 120 may include a semiconductor layer stack 121. The semiconductor layer stack 121 may include a first conductive layer 101, a dielectric layer stack DE2, and a second conductive layer 103. The dielectric layer stack DE2 may include a dielectric layer HK and an interface control layer ICL2. The interface control layer ICL2 may be formed between the dielectric layer HK and the second conductive layer 103.

The interface control layer ICL2 may include a dopant-containing layer HKD and a high bandgap layer HBG. The interface control layer ICL2 may further include a leakage blocking layer HLK formed at an interface between the dopant-containing layer HKD and the dielectric layer HK.

The leakage blocking layer HLK may prevent a dopant from being excessively diffused from the dopant-containing layer HKD. The leakage blocking layer HLK may have a lower dielectric constant than the dopant-containing layer HKD. The leakage blocking layer HLK may be extremely thin. The leakage blocking layer HLK may contain a leakage blocking material LK. The leakage blocking layer HLK may include aluminum. The leakage blocking layer HLK may include an aluminum oxide. The leakage blocking layer HLK may include a silicon oxide. The leakage blocking layer HLK may be extremely thin so as to suppress an increase in capacitance of the dielectric layer stack DE2. In addition, the leakage blocking layer HLK may have a thickness for preventing a dopant from being excessively diffused from the dopant-containing layer HKD and preventing leakage. The thickness of the leakage blocking layer HLK may be 0.1 nm to 0.2 nm.

The dielectric layer stack DE2 may be formed by sequentially stacking the dielectric layer HK, the leakage blocking layer HLK, the dopant-containing layer HKD and the high bandgap layer HBG. The thickness of the leakage blocking layer HLK may be the same as that of the high bandgap layer HBG. The leakage blocking layer HLK may be the same or a different material as or from the high bandgap layer HBG. The leakage blocking layer HLK and the high bandgap layer HBG may have high bandgaps.

FIGS. 4A to 4D are cross-sectional views illustrating application examples of the semiconductor device 120 shown in FIG. 3.

Figure 4A:
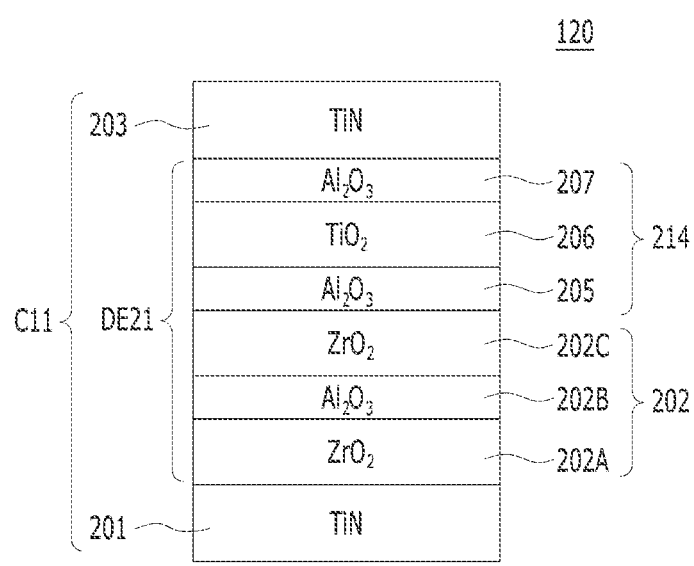
FIGS. 4A to 4D are cross-sectional views illustrating application examples of the semiconductor device shown in FIG. 3.

Referring to FIG. 4A, the semiconductor device 120 may include a capacitor C11. The capacitor C11 may correspond to the semiconductor layer stack 121 shown in FIG. 3.

The capacitor C11 may include a bottom electrode 201, a dielectric layer 202, and a top electrode 203. The capacitor C11 may further include an interface control layer 214 between the dielectric layer 202 and the top electrode 203. The stacked structure of the dielectric layer 202 and the interface control layer 214 may be a dielectric layer stack DE21.

Each of the bottom electrode 201 and the top electrode 203 may include a titanium nitride (TiN). In some embodiments, the bottom electrode 201 and the top electrode 203 may include a conductive metal oxide, a metal nitride, a metal or any combinations thereof.

The dielectric layer 202 may be formed by sequentially stacking a zirconium oxide 202A, an aluminum oxide 202B and a zirconium oxide 202C. In other words, the dielectric layer 202 may include a ZAZ ($ZrO_2/Al_2O_3/ZrO_2$). The aluminum oxide 202B may be thinner than the zirconium oxides 202A and 202C.

The interface control layer 214 may include an ATA ($Al_2O_3/TiO_2/Al_2O_3$) in which an aluminum oxide 205, a titanium oxide 206 and an aluminum oxide 207 are sequentially stacked. The aluminum oxides 205 and 207 may be thinner than the titanium oxide 206. The titanium oxide 206 may correspond to the dopant-containing layer HKD shown in FIG. 3. The aluminum oxide 207 may correspond to the high bandgap layer HBG shown in FIG. 3. The aluminum oxide 205 may correspond to the leakage blocking layer HLK shown in FIG. 3.

The dielectric layer stack DE21 may be formed of a ZAZATA ($ZrO_2/Al_2O_3/ZrO_2/Al_2O_3/TiO_2/Al_2O_3$) in which the zirconium oxide 202A, the aluminum oxide 202B, the zirconium oxide 202C, the aluminum oxide 205, the titanium oxide 206 and the aluminum oxide 207 are sequentially stacked. The aluminum oxides 205 and 207 may be thinner than the titanium oxide 206. The aluminum oxides 205 and 207 may be thinner than the aluminum oxide 202B of the dielectric layer 202.

Figure 4B:
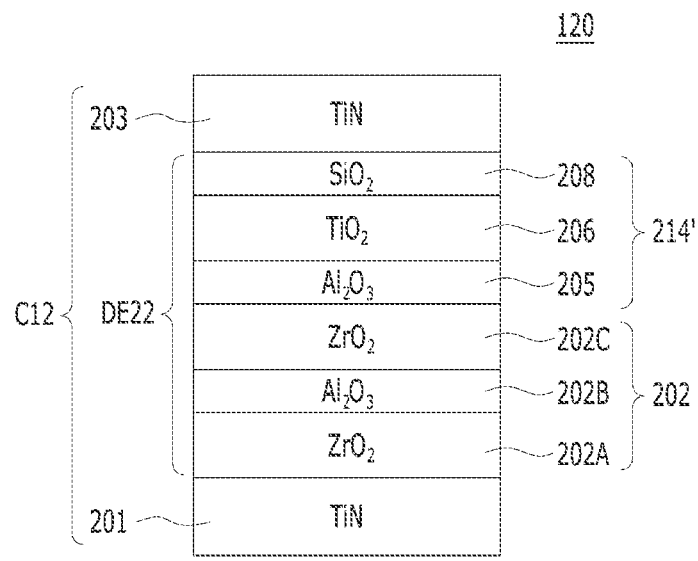

Referring to FIG. 4B, the remaining configurations of a capacitor C12 except for an interface control layer 214' may be the same as those of the capacitor C11 shown in FIG. 4A.

The interface control layer 214' may include an ATS ($Al_2O_3/TiO_2/SiO_2$) in which an aluminum oxide 205, a titanium oxide 206 and a silicon oxide 208 are sequentially stacked. The aluminum oxide 205 and the silicon oxide 208 may be thinner than the titanium oxide 206. The titanium oxide 206 may correspond to the dopant-containing layer HKD shown in FIG. 3. The silicon oxide 208 may correspond to the high bandgap layer HBG shown in FIG. 3.

A dielectric layer stack DE22 may be formed of a ZAZATS ($ZrO_2/Al_2O_3/ZrO_2/Al_2O_3/TiO_2/SiO_2$) in which a zirconium oxide 202A, an aluminum oxide 202B, a zirconium oxide 202C, the aluminum oxide 205, the titanium oxide 206 and the silicon oxide 208 are sequentially stacked. The aluminum oxide 205 and the silicon oxide 208 may be thinner than the titanium oxide 206. The aluminum oxide 205 may be thinner than the aluminum oxide 202B of a dielectric layer 202. The thickness of the aluminum oxide 205 may be the same as that of the silicon oxide 208.

Figure 4C:
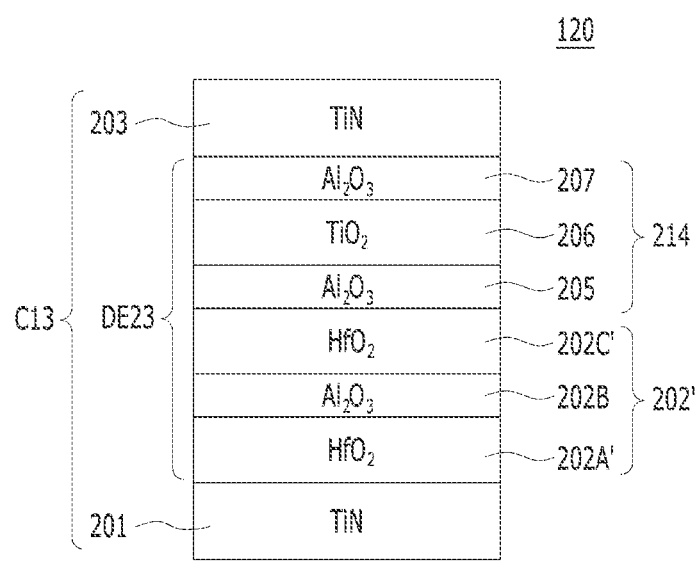

Referring to FIG. 4C, the remaining configurations of a capacitor C13 except for a dielectric layer 202' may be the same as those of the capacitor C11 shown in FIG. 4A.

The dielectric layer 202' may be formed by sequentially stacking a hafnium oxide 202A', an aluminum oxide 202B and a hafnium oxide 202C'. In other words, the dielectric layer 202' may include a HAH ($HfO_2/Al_2O_3/HfO_2$) structure. The aluminum oxide 202B may be thinner than the hafnium oxides 202A' and 202C'.

A dielectric layer stack DE23 may be formed of a HAHATA ($HfO_2/Al_2O_3/HfO_2/Al_2O_3/TiO_2/Al_2O_3$) in which the hafnium oxide 202A', the aluminum oxide 202B, the hafnium oxide 202C', an aluminum oxide 205, a titanium oxide 206 and an aluminum oxide 207 are sequentially stacked. The aluminum oxides 205 and 207 may be thinner than the titanium oxide 206. The aluminum oxides 205 and 207 may be thinner than the aluminum oxide 202B of the dielectric layer 202'. The thickness of the aluminum oxide 205 may be the same as that of the aluminum oxide 207.

Figure 4D:
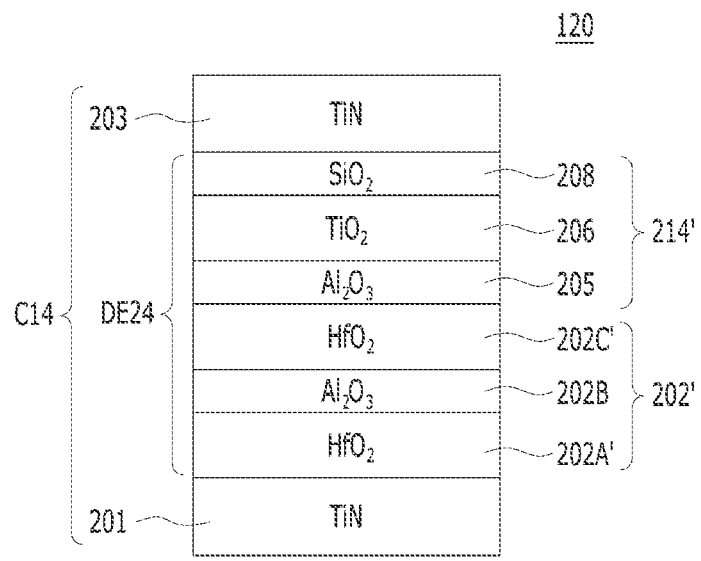

Referring to FIG. 4D, the remaining configurations of a capacitor C14 except for an interface control layer 214' may be the same as those of the capacitor C13 shown in FIG. 4C.

The interface control layer 214' may include an ATS ($Al_2O_3/TiO_2/SiO_2$) in which an aluminum oxide 205, a titanium oxide 206 and a silicon oxide 208 are sequentially stacked. The silicon oxide 208 may be thinner than the titanium oxide 206.

A dielectric layer stack DE24 may be formed of a HAHATS ($HfO_2/Al_2O_3/HfO_2/Al_2O_3/TiO_2/SiO_2$) in which a hafnium oxide 202A', an aluminum oxide 202B, a hafnium oxide 202C', the aluminum oxide 205, the titanium oxide 206 and the silicon oxide 208 are sequentially stacked. The aluminum oxide 205 and the silicon oxide 208 may be thinner than the titanium oxide 206. The aluminum oxide 205 may be thinner than the aluminum oxide 202B of the dielectric layer 202'. The thickness of the aluminum oxide 205 may be the same as that of the silicon oxide 208.

According to the above-described application examples of the semiconductor device 120, the aluminum oxides 202B, 205 and 207 and the silicon oxide 208 may be thin to increase capacitance of the dielectric layer stacks DE21, DE22, DE23 and DE24. The aluminum oxides 202B, 205 and 207 and the silicon oxide 208 as materials having lower dielectric constants than the zirconium oxides 202A and 202C, the hafnium oxides 202A' and 202C' and the titanium oxide 206 may suppress a decrease in capacitance by being formed extremely thin. The equivalent oxide layer thicknesses (EOT) of the dielectric layer stacks DE21, DE22, DE23 and DE24 may increase as the thicknesses of the aluminum oxides 202B, 205 and 207 and the silicon oxide 208 increase. Therefore, in order to decrease the equivalent oxide layer thicknesses, the thicknesses of the aluminum oxides 202B, 205 and 207 and the silicon oxide 208 may be 0.1 nm to 0.2 nm. The aluminum oxides 205 and 207 and the silicon oxide 208 of the interface control layers 214 and 214' may be thinner than the aluminum oxide 202B of the dielectric layers 202 and 202'.

Figure 5:
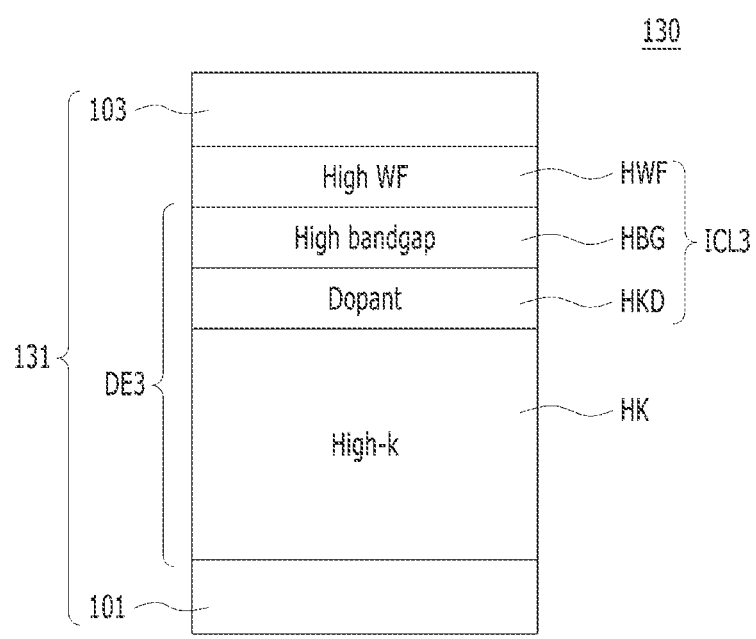
FIG. 5 is a cross-sectional view of a semiconductor device in accordance with an embodiment.

FIG. 5 is a cross-sectional view of a semiconductor device 130 in accordance with an embodiment. Detailed descriptions of the components and configurations of the semiconductor device 130 that are the same as or similar to those of the semiconductor device 100 shown in FIG. 1 are omitted.

Referring to FIG. 5, the semiconductor device 130 may include a semiconductor layer stack 131. The semiconductor layer stack 131 may include a first conductive layer 101, a dielectric layer stack DE3, and a second conductive layer 103. The dielectric layer stack DE3 may include a dielectric layer HK and an interface control layer ICL3. The interface control layer ICL3 may be formed between the dielectric layer HK and the second conductive layer 103.

The interface control layer ICL3 may include a dopant-containing layer HKD, a high bandgap layer HBG, and a high work function layer HWF. The high work function layer HWF may be in direct contact with the second conductive layer 103.

The high work function layer HWF may be formed at an interface between the high bandgap layer HBG and the second conductive layer 103. The high work function layer HWF may be a material containing some components of the high bandgap layer HBG and some components of the second conductive layer 103. In some embodiments, the high work function layer HWF may be formed by the reaction of the high bandgap layer HBG and the second conductive layer 103. For example, a surface of the high bandgap layer HBG may be intermixed with a portion of the second conductive layer 103. When the high bandgap layer HBG includes aluminum oxide and the second conductive layer 103 includes a titanium nitride, the high work function layer HWF may be formed of a compound in the form of a titanium aluminum nitride (TiAlN). Since the titanium aluminum nitride (TiAlN) has a higher work function than the titanium nitride, the titanium aluminum nitride (TiAlN) may reduce leakage. The high work function layer HWF may be a conductive material, thereby being used as an electrode material together with the second conductive layer 103. The high work function layer HWF may be an ultra-thin layer.

The dielectric layer stack DE3 may be formed by sequentially stacking the dielectric layer HK, the dopant-containing layer HKD and the high bandgap layer HBG.

FIGS. 6A to 6D are cross-sectional views illustrating application examples of the semiconductor device 130 shown in FIG. 5. In FIGS. 6A to 6D, the semiconductor device 130 may include capacitors C21 to C24. The capacitors C21 to C24 may correspond to the semiconductor layer stack 131 shown in FIG. 5.

Figure 6A:
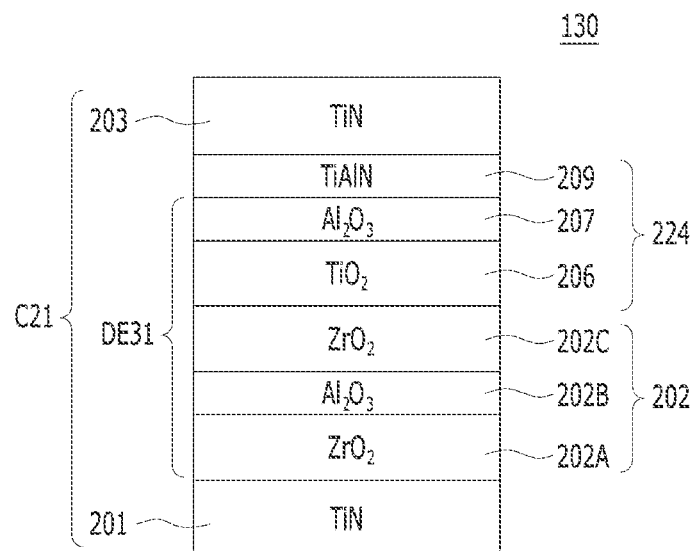
FIGS. 6A to 6D are cross-sectional views illustrating application examples of the semiconductor device shown in FIG. 5.

Referring to FIG. 6A, the capacitor C21 may include a bottom electrode 201, a dielectric layer 202, and a top electrode 203. The capacitor C21 may further include an interface control layer 224 between the dielectric layer 202 and the top electrode 203. The stacked structure of the dielectric layer 202 and the interface control layer 224 may be a dielectric layer stack DE31.

Each of the bottom electrode 201 and the top electrode 203 may include a titanium nitride (TiN). In some embodiments, the bottom electrode 201 and the top electrode 203 may include a conductive metal oxide, a metal nitride, a metal or any combinations thereof.

The dielectric layer 202 may be formed by sequentially stacking a zirconium oxide 202A, an aluminum oxide 202B and a zirconium oxide 202C. In other words, the dielectric layer 202 may include a ZAZ ($ZrO_2/Al_2O_3/ZrO_2$) structure. The aluminum oxide 202B may be thinner than the zirconium oxides 202A and 202C.

The interface control layer 224 may include a TA ($TiO_2/Al_2O_3$) in which a titanium oxide 206 and an aluminum oxide 207 are sequentially stacked. The aluminum oxide 207 may be thinner than the titanium oxide 206. The titanium oxide 206 may correspond to the dopant-containing layer HKD shown in FIG. 5. The aluminum oxide 207 may correspond to the high bandgap layer HBG shown in FIG. 5. The interface control layer 224 may further include a titanium aluminum nitride (TiAlN) 209. The titanium aluminum nitride 209 may correspond to the high work function layer HWF shown in FIG. 5.

The dielectric layer stack DE31 may be formed of a ZAZTA ($ZrO_2/Al_2O_3/ZrO_2/TiO_2/Al_2O_3$) structure in which the zirconium oxide 202A, the aluminum oxide 202B, the zirconium oxide 202C, the titanium oxide 206 and the aluminum oxide 207 are sequentially stacked.

Figure 6B:
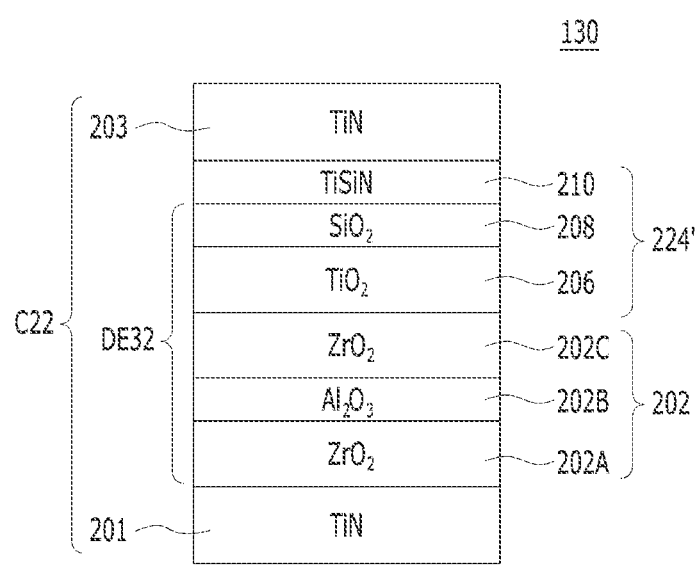

Referring to FIG. 6B, the remaining configurations of the capacitor C22 except for an interface control layer 224' may be the same as those of the capacitor C21 shown in FIG. 6A.

The interface control layer 224' may include a TS ($TiO_2/SiO_2$) structure in which a titanium oxide 206 and a silicon oxide 208 are sequentially stacked. The silicon oxide 208 may be thinner than the titanium oxide 206. The titanium oxide 206 may correspond to the dopant-containing layer HKD shown in FIG. 5. The silicon oxide 208 may correspond to the high bandgap layer HBG shown in FIG. 5. The interface control layer 224' may further include a titanium silicon nitride (TiSiN) 210. The titanium silicon nitride 210 may correspond to the high work function layer HWF shown in FIG. 5.

A dielectric layer stack DE32 may be formed of a ZAZTS ($ZrO_2/Al_2O_3/ZrO_2/TiO_2/SiO_2$) structure in which a zirconium oxide 202A, an aluminum oxide 202B, a zirconium oxide 202C, the titanium oxide 206 and the silicon oxide 208 are sequentially stacked.

Figure 6C:
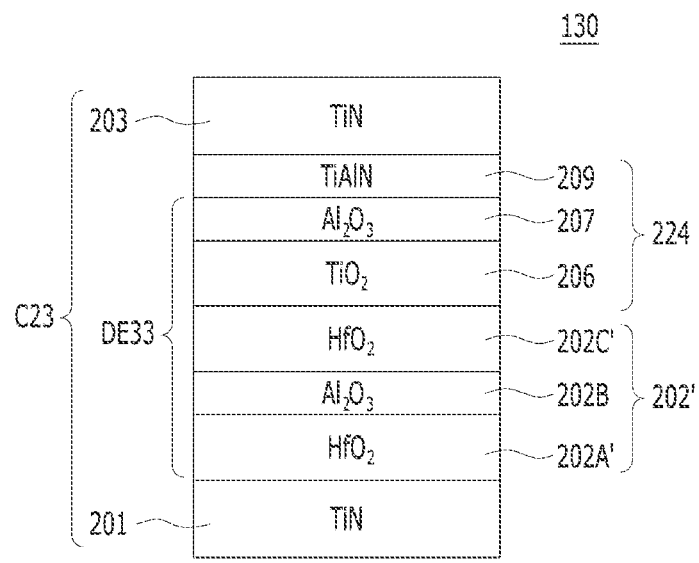

Referring to FIG. 6C, the remaining configurations of the capacitor C23 except for a dielectric layer 202' may be the same as those of the capacitor C21 shown in FIG. 6A.

The dielectric layer 202' may be formed by sequentially stacking a hafnium oxide 202A', an aluminum oxide 202B and a hafnium oxide 202C'. In other words, the dielectric layer 202' may include a HAH ($HfO_2/Al_2O_3/HfO_2$) structure. The aluminum oxide 202B may be thinner than the hafnium oxides 202A' and 202C'.

A dielectric layer stack DE33 may be formed of a HAHTA ($HfO_2/Al_2O_3/HfO_2/TiO_2/Al_2O_3$) structure in which the hafnium oxide 202A', the aluminum oxide 202B, the hafnium oxide 202C', a titanium oxide 206 and an aluminum oxide 207 are sequentially stacked.

Figure 6D:
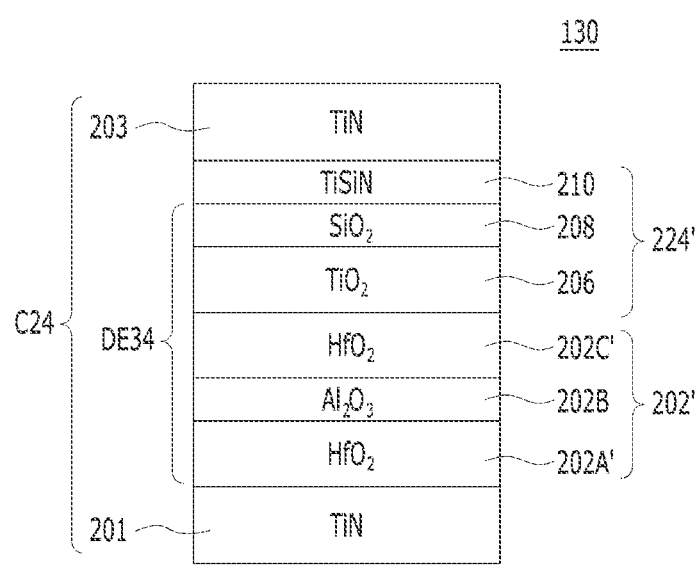

Referring to FIG. 6D, the remaining configurations of the capacitor C24 except for an interface control layer 224' may be the same as those of the capacitor C23 shown in FIG. 6C.

The interface control layer 224' may include a TS ($TiO_2/SiO_2$) structure in which a titanium oxide 206 and a silicon oxide 208 are sequentially stacked. The silicon oxide 208 may be thinner than the titanium oxide 206. The interface control layer 224' may further include a titanium silicon nitride (TiSiN) 210 formed on the silicon oxide 208.

A dielectric layer stack DE34 may be formed of an HAHTS ($HfO_2/Al_2O_3/HfO_2/TiO_2/SiO_2$) structure in which a hafnium oxide 202A', an aluminum oxide 202B, a hafnium oxide 202C', the titanium oxide 206 and the silicon oxide 208 are sequentially stacked.

According to the above-described application examples of the semiconductor device 130, the aluminum oxides 202B and 207 and the silicon oxide 208 may be thin to increase capacitance of the dielectric layer stacks DE31, DE32, DE33 and DE34. The aluminum oxides 202B and 207 and the silicon oxide 208 as materials having lower dielectric constants than the zirconium oxides 202A and 202C, the hafnium oxides 202A' and 202C' and the titanium oxide 206 may suppress a decrease in capacitance by being formed extremely thin. The equivalent oxide layer thicknesses (EOT) of the dielectric layer stacks DE31, DE32, DE33 and DE34 may increase as the thicknesses of the aluminum oxides 202B and 207 and the silicon oxide 208 increase. Accordingly, the thicknesses of the aluminum oxides 202B and 207 and the silicon oxide 208 may be 0.1 nm to 0.2 nm. The aluminum oxide 207 and the silicon oxide 208 of the interface control layers 224 and 224' may be thinner than the aluminum oxide 202B of the dielectric layers 202 and 202'.

Figure 7:
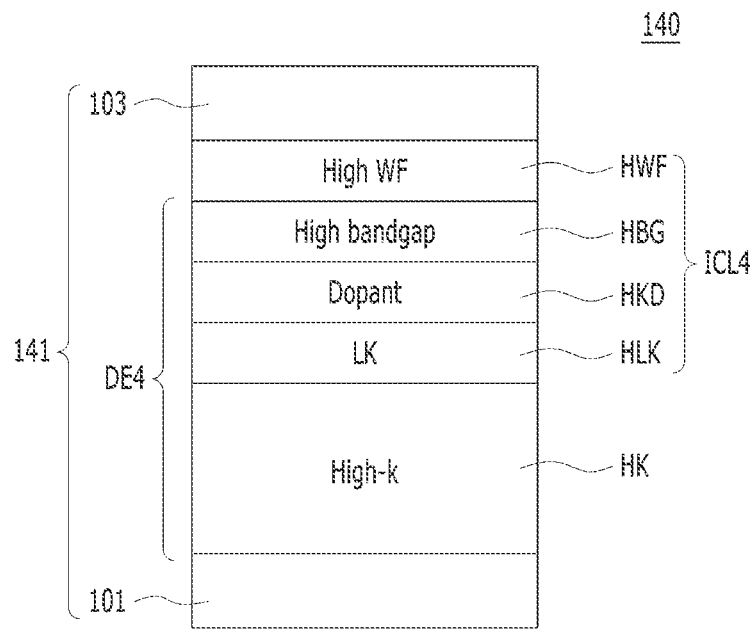
FIG. 7 is a cross-sectional view of a semiconductor device in accordance with an embodiment.

FIG. 7 is a cross-sectional view of a semiconductor device 140 in accordance with an embodiment. Detailed descriptions of the components and configurations of the semiconductor device 140 that are the same as or similar to those of the semiconductor devices 100, 120 and 130 shown in FIGS. 1, 3 and 5 respectively are omitted.

Referring to FIG. 7, the semiconductor device 140 may include a semiconductor layer stack 141. The semiconductor layer stack 141 may include a first conductive layer 101, a dielectric layer stack DE4, and a second conductive layer 103. The dielectric layer stack DE4 may include a dielectric layer HK and an interface control layer ICL4. The interface control layer ICL4 may be formed between the dielectric layer HK and the second conductive layer 103.

The interface control layer ICL4 may include a leakage blocking layer HLK, a dopant-containing layer HKD, a high bandgap layer HBG, and a high work function layer HWF.

The dielectric layer stack DE4 may be formed by sequentially stacking the dielectric layer HK, the leakage blocking layer HLK, the dopant-containing layer HKD and the high bandgap layer HBG.

FIGS. 8A to 8D are cross-sectional views illustrating application examples of the semiconductor device 140 shown in FIG. 7.

Figure 8A:
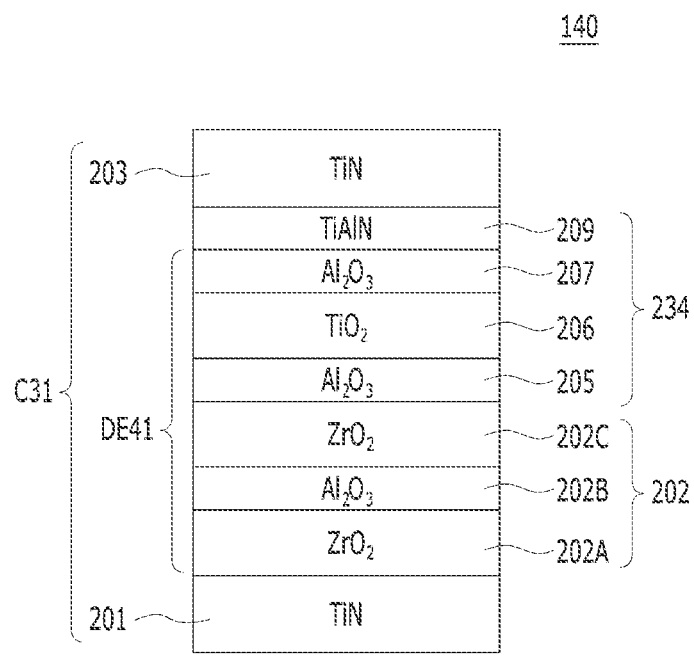
FIGS. 8A to 8D are cross-sectional views illustrating application examples of the semiconductor device shown in FIG. 7.

Referring to FIG. 8A, the semiconductor device 140 may include a capacitor C31. The capacitor C31 may correspond to the semiconductor layer stack 141 shown in FIG. 7.

The capacitor C31 may include a bottom electrode 201, a dielectric layer 202, and a top electrode 203. The capacitor C31 may further include an interface control layer 234 between the dielectric layer 202 and the top electrode 203.

Each of the bottom electrode 201 and the top electrode 203 may include a titanium nitride (TiN). In some embodiments, the bottom electrode 201 and the top electrode 203 may include a conductive metal oxide, a metal nitride, a metal or any combinations thereof.

The dielectric layer 202 may be formed by sequentially stacking a zirconium oxide 202A, an aluminum oxide 202B and a zirconium oxide 202C. In other words, the dielectric layer 202 may include a ZAZ ($ZrO_2/Al_2O_3/ZrO_2$) structure. The aluminum oxide 202B may be thinner than the zirconium oxides 202A and 202C.

The interface control layer 234 may include an ATA ($Al_2O_3/TiO_2/Al_2O_3$) structure in which an aluminum oxide 205, a titanium oxide 206 and an aluminum oxide 207 are sequentially stacked. The aluminum oxides 205 and 207 may be thinner than the titanium oxide 206. The titanium oxide 206 may correspond to the dopant-containing layer HKD shown in FIG. 7. The aluminum oxide 207 may correspond to the high bandgap layer HBG shown in FIG. 7. The aluminum oxide 205 may correspond to the leakage blocking layer HLK shown in FIG. 7. The interface control layer 234 may further include a titanium aluminum nitride (TiAlN) 209. The titanium aluminum nitride 209 may correspond to the high work function layer HWF shown in FIG. 7.

A dielectric layer stack DE41 may be formed of a ZAZATA ($ZrO_2/Al_2O_3/ZrO_2/Al_2O_3/TiO_2/Al_2O_3$) structure in which the zirconium oxide 202A, the aluminum oxide 202B, the zirconium oxide 202C, the aluminum oxide 205, the titanium oxide 206 and the aluminum oxide 207 are sequentially stacked. The aluminum oxide 207 may be thinner than the titanium oxide 206. The aluminum oxide 207 may be thinner than the aluminum oxide 202B of the dielectric layer 202.

Figure 8B:
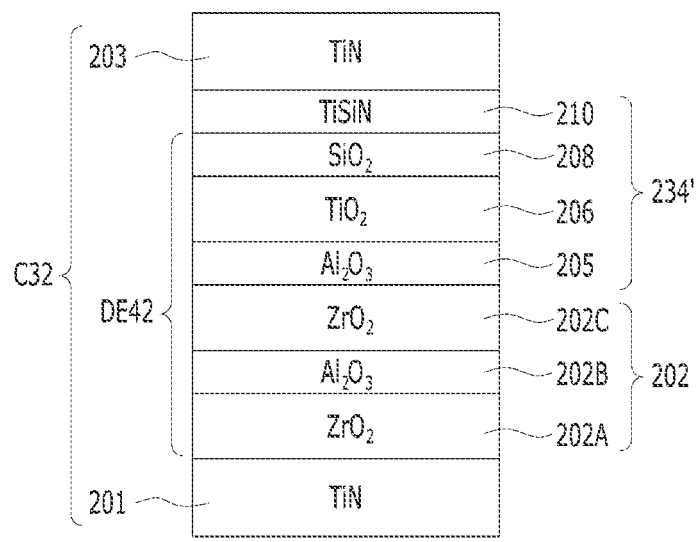

Referring to FIG. 8B, the remaining configurations of a capacitor C32 except for an interface control layer 234' may be the same as those of the capacitor C31 shown in FIG. 8A.

The interface control layer 234' may include an ATS ($Al_2O_3/TiO_2/SiO_2$) structure in which an aluminum oxide 205, a titanium oxide 206 and a silicon oxide 208 are sequentially stacked. The aluminum oxide 205 and the silicon oxide 208 may be thinner than the titanium oxide 206. The titanium oxide 206 may correspond to the dopant-containing layer HKD shown in FIG. 7. The silicon oxide 208 may correspond to the high bandgap layer HBG shown in FIG. 7. The interface control layer 234' may further include a titanium silicon nitride (TiSiN) 210. The titanium silicon nitride 210 may correspond to the high work function layer HWF shown in FIG. 7. The titanium silicon nitride 210 may be extremely thin.

A dielectric layer stack DE42 may be formed of a ZAZATS ($ZrO_2/Al_2O_3/ZrO_2/Al_2O_3/TiO_2/SiO_2$) structure in which a zirconium oxide 202A, an aluminum oxide 202B, a zirconium oxide 202C, the aluminum oxide 205, the titanium oxide 206 and the silicon oxide 208 are sequentially stacked. The silicon oxide 208 may be thinner than the titanium oxide 206. The aluminum oxide 205 may be thinner than the aluminum oxide 202B of a dielectric layer 202.

Figure 8C:
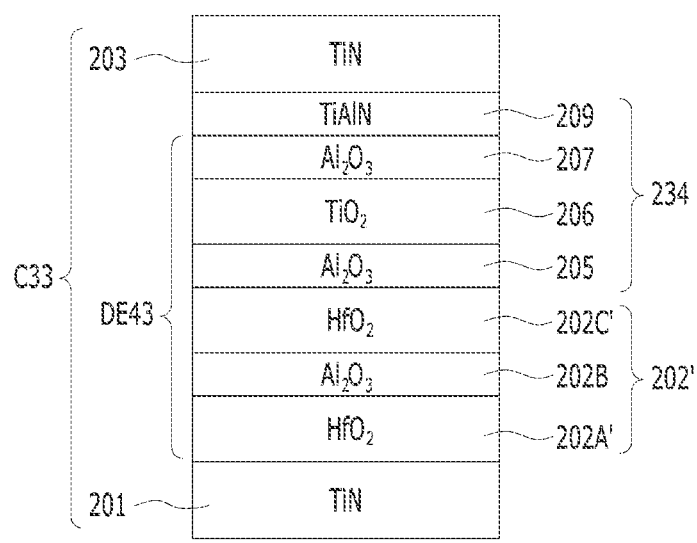

Referring to FIG. 8C, the remaining configurations of a capacitor C33 except for a dielectric layer 202' may be the same as those of the capacitor C31 shown in FIG. 8A.

The dielectric layer 202' may be formed by sequentially stacking a hafnium oxide 202A', an aluminum oxide 202B and a hafnium oxide 202C'. In other words, the dielectric layer 202' may include a HAH ($HfO_2/Al_2O_3/HfO_2$) structure. The aluminum oxide 202B may be thinner than the hafnium oxides 202A' and 202C'.

An interface control layer 234 may further include a titanium aluminum nitride (TiAlN) 209. The titanium aluminum nitride 209 may be extremely thin.

A dielectric layer stack DE43 may be formed of an HAHATA ($HfO_2/Al_2O_3/HfO_2/Al_2O_3/TiO_2/Al_2O_3$) structure in which the hafnium oxide 202A', the aluminum oxide 202B, the hafnium oxide 202C', an aluminum oxide 205, a titanium oxide 206 and an aluminum oxide 207 are sequentially stacked. The aluminum oxide 207 may be thinner than the titanium oxide 206. The aluminum oxides 205 and 207 may be thinner than the aluminum oxide 202B of the dielectric layer 202'.

Figure 8D:
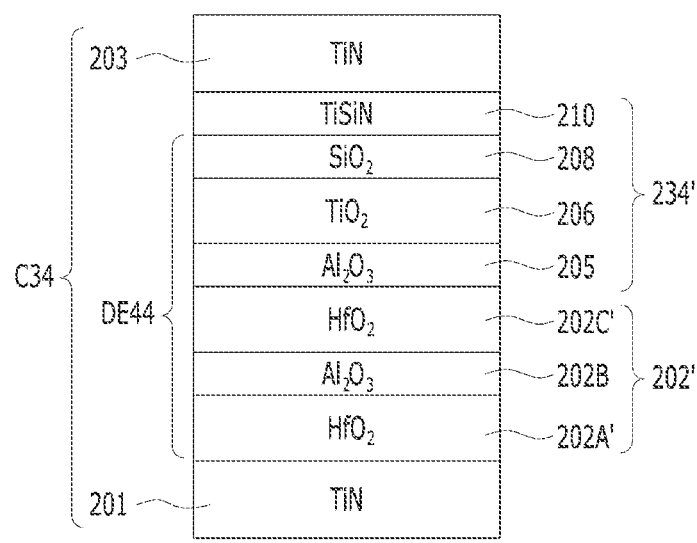

Referring to FIG. 8D, the remaining configurations of a capacitor C34 except for an interface control layer 234' may be the same as those of the capacitor C33 shown in FIG. 8C.

The interface control layer 234' may include an ATS ($Al_2O_3/TiO_2/SiO_2$) structure in which an aluminum oxide 205, a titanium oxide 206 and a silicon oxide 208 are sequentially stacked. The silicon oxide 208 may be thinner than the titanium oxide 206. The interface control layer 234' may further include a titanium silicon nitride (TiSiN) 210. The titanium silicon nitride 210 may correspond to the high work function layer HWF shown in FIG. 7. The titanium silicon nitride 210 may be extremely thin.

A dielectric layer stack DE44 may be formed of an HAHATS ($HfO_2/Al_2O_3/HfO_2/Al_2O_3/TiO_2/SiO_2$) structure in which a hafnium oxide 202A', an aluminum oxide 202B, a hafnium oxide 202C', the aluminum oxide 205, the titanium oxide 206 and the silicon oxide 208 are sequentially stacked. The silicon oxide 208 may be thinner than the titanium oxide 206. The aluminum oxide 205 may be thinner than the aluminum oxide 202B of the dielectric layer 202'.

According to the above-described application examples of the semiconductor device 140, the aluminum oxides 202B, 205 and 207 and the silicon oxide 208 may be thin to increase capacitance of the dielectric layer stacks DE41, DE42, DE43 and DE44. The aluminum oxides 202B, 205 and 207 and the silicon oxide 208 as materials having lower dielectric constants than the zirconium oxides 202A and 202C, the hafnium oxides 202A' and 202C' and the titanium oxide 206 may suppress a decrease in capacitance by being formed extremely thin. The equivalent oxide layer thicknesses (EOT) of the dielectric layer stacks DE41, DE42, DE43 and DE44 may increase as the thicknesses of the aluminum oxides 202B, 205 and 207 and the silicon oxide 208 increase. Therefore, in order to decrease the equivalent oxide layer thicknesses, the thicknesses of the aluminum oxides 202B, 205 and 207 and the silicon oxide 208 may be 0.1 nm to 0.2 nm. The aluminum oxides 205 and 207 and the silicon oxide 208 of the interface control layers 234 and 234' may be thinner than the aluminum oxide 202B of the dielectric layers 202 and 202'.

According to the above-described embodiments, the top electrode 203 may be formed under a reducing atmosphere. The reducing atmosphere may include a reducing material such as hydrogen, a hydrogen compound or a nitrogen-hydrogen compound. For example, the top electrode 203 may be formed of a titanium nitride (TiN), and the titanium nitride (TiN) may be formed of $TiCl_4$ and $NH_3$. Herein, $NH_3$ may be the reducing material.

The aluminum oxide 207 and the silicon oxide 208 may prevent the zirconium oxide 202C and the hafnium oxide 202C' from being reduced when the top electrode 203 is formed. Accordingly, the aluminum oxide 207 and silicon oxide 208 may be referred to as reduction preventing layers.

As a comparative example, when the top electrode 203 is formed in a reducing atmosphere without the aluminum oxide 207 and the silicon oxide 208, the zirconium oxide 202C and the hafnium oxide 202C', which are the uppermost layers of the dielectric layers 202 and 202', may be easily reduced.

As another comparative example, when the top electrode 203 is formed in a reducing atmosphere without the aluminum oxide 207 and the silicon oxide 208, the titanium oxide 206 may be easily reduced.

As described above, when the zirconium oxide 202C, the hafnium oxide 202C' and the titanium oxide 206 are directly exposed to a reducing atmosphere, reduction easily occurs. The aluminum oxide 207 has a high Gibbs free energy. The aluminum oxide 207 may have a higher Gibbs free energy than the zirconium oxide 202C, the hafnium oxide 202C' and the titanium oxide 206. For example, the Gibbs free energy of the aluminum oxide 207 is approximately −1054.9 KJ/mol, which has a more negative value than the zirconium oxide 202C, the hafnium oxide 202C' and the titanium oxide 206. Having a high Gibbs free energy results in relatively less reduction than zirconium oxide 202C, the hafnium oxide 202C' and the titanium oxide 206. In other words, since the aluminum oxide 207 serves as a reduction preventing layer, defects such as oxygen loss of the zirconium oxide 202C, the hafnium oxide 202C' and the titanium oxide 206 may be suppressed by the aluminum oxide 207.

As such, since the aluminum oxide 207 suppresses the defects of the zirconium oxide 202C, the hafnium oxide 202C' and the titanium oxide 206, the equivalent oxide layer thickness (EOT) of the dielectric layer stacks DE11 to D44 may decrease, and the capacitance thereof may increase. In addition, the leakage caused by the defects may decrease.

According to the above-described embodiments, the titanium oxide 206 is an extremely high-k material of 50 or higher. Thus, the titanium oxide 206 may serve to increase the dielectric constants of the zirconium oxide 202C and the hafnium oxide 202C'.

Titanium of the titanium oxide 206 is a dopant that is easily diffused thermally. Accordingly, the titanium oxide 206 and the zirconium oxide 202C may be intermixed.

The titanium of the titanium oxide 206 may be diffused into the zirconium oxide 202C. For example, the titanium oxide 206 and the zirconium oxide 202C may be intermixed to form a titanium oxide-zirconium oxide compound ($TiO_2$—$ZrO_2$ Alloy). The titanium oxide-zirconium oxide compound ($TiO_2$—$ZrO_2$ Alloy) has a higher dielectric constant than the zirconium oxide 202C. The titanium oxide-zirconium oxide compound ($TiO_2$—$ZrO_2$ Alloy) may be referred to as a titanium-doped zirconium oxide (Ti-doped $ZrO_2$).

The titanium oxide 206, the zirconium oxide 202C and the aluminum oxide 205 may be intermixed since the aluminum oxide 205, which is thin, is disposed between the titanium oxide 206 and the zirconium oxide 202C. For example, the titanium of the titanium oxide 206 may be diffused into the zirconium oxide 202C and the aluminum oxide 205. The titanium oxide 206, the zirconium oxide 202C and the aluminum oxide 205 may be intermixed to form a titanium-doped zirconium aluminum oxide (Ti-doped ZrAlO). The titanium-doped zirconium aluminum oxide (Ti-doped ZrAlO) has a higher dielectric constant than the zirconium oxide 202C. The doping amount of the titanium may be controlled by the thickness of the titanium oxide 206. The titanium oxide 206 may be 0.3 nm to 1 nm.

In some embodiments, the zirconium oxide 202C may include a titanium-doped zirconium oxide. Accordingly, the dielectric layer 202 may be formed by sequentially stacking the zirconium oxide 202A, the aluminum oxide 202B and the titanium-doped zirconium oxide.

The titanium of the titanium oxide 206 may be diffused into the hafnium oxide 202C'. For example, the titanium oxide 206 and the hafnium oxide 202C' may be intermixed to form a titanium oxide-hafnium oxide compound ($TiO_2$—$HfO_2$ Alloy). The titanium oxide-hafnium oxide compound ($TiO_2$—$HfO_2$ Alloy) has a higher dielectric constant than the hafnium oxide 202C'. The titanium oxide-hafnium oxide compound ($TiO_2$—$HfO_2$ Alloy) may be referred to as a titanium-doped hafnium oxide (Ti-doped $HfO_2$).

The titanium of the titanium oxide 206 may be diffused into the aluminum oxide 205 and the hafnium oxide 202C'. For example, the titanium oxide 206, the aluminum oxide 205 and the hafnium oxide 202C' may be intermixed to form a titanium-doped hafnium aluminum oxide (Ti-doped HfAlO). The titanium-doped hafnium aluminum oxide (Ti-doped HfAlO) has a higher dielectric constant than the hafnium oxide 202C'.

In some embodiments, the hafnium oxide 202C may include a titanium-doped hafnium oxide. Accordingly, the dielectric layer 202' may be formed by sequentially stacking the hafnium oxide 202A', the aluminum oxide 202B and the titanium-doped hafnium oxide.

The aluminum oxide 205 is a material that suppresses leakage of the dielectric layers 202 and 202'. In addition, the aluminum oxide 205 serves as a barrier to suppress excessive titanium doping. For example, the aluminum oxide 205 may suppress excessive diffusion of titanium from the titanium oxide 206 into the dielectric layers 202 and 202'.

As described above, the titanium oxide 206 serves to further increase the dielectric constants of the dielectric layers 202 and 202', and the aluminum oxide 207 and the silicon oxide 208 serve to prevent the dielectric layers 202 and 202' and the titanium oxide 206 from being reduced. The aluminum oxide 205 serves as a barrier to suppress the leakage and prevent the excessive diffusion of titanium.

The aluminum oxide 207 may increase conduction band offset (CBO) between the top electrode 103 and the dielectric layers 202 and 202'. Since the aluminum oxide 207 has a high bandgap, the aluminum oxide 207 forms a high conduction band offset (High CBO) when coupled to the top electrode 203. By forming the high conduction band offset, the barrier to which electrons pass may be increased to reduce leakage. The silicon oxide 208 may also increase conduction band offset (CBO) between the top electrode 103 and the dielectric layers 202 and 202' in the same manner as the aluminum oxide 207.

Other high bandgap materials may include a lanthanum oxide or an yttrium oxide.

The aluminum oxide 207 may be extremely thin. The aluminum oxide 207 may have a thickness of 0.1 nm to 0.2 nm. The aluminum oxide 207 may be intermixed with a portion of the top electrode 203. An intermixed compound may be formed at an interface between the aluminum oxide 207 and the top electrode 203. For example, when the top electrode 203 is formed, a top surface of the aluminum oxide 207 may be reduced and intermixed with the top electrode 203. When the top electrode 203 includes a titanium nitride, the intermixed compound may be formed of a compound in the form of a titanium aluminum nitride (TiAlN) 209. Since the titanium aluminum nitride (TiAlN) 209 has a higher work function than the titanium nitride, leakage may be reduced by the titanium aluminum nitride (TiAlN) 209. The leakage may be further reduced by the aluminum oxide 207 and the titanium aluminum nitride (TiAlN) 209.

The silicon oxide 208 may be extremely thin. The thickness of the silicon oxide 208 may be 0.1 nm to 0.2 nm. The silicon oxide 208 may be intermixed with a portion of the top electrode 203. An intermixed compound may be formed at an interface between the silicon oxide 208 and the top electrode 203. For example, when the top electrode 203 is formed, a top surface of the silicon oxide 208 may be reduced and intermixed with the top electrode 203. When the top electrode 203 includes a titanium nitride, the intermixed compound may be formed of a compound in the form of a titanium silicon nitride (TiSiN) 210. Since the titanium silicon nitride (TiSiN) 210 has a higher work function than the titanium nitride, leakage may be reduced by the titanium silicon nitride (TiSiN) 210.

Figure 9A:
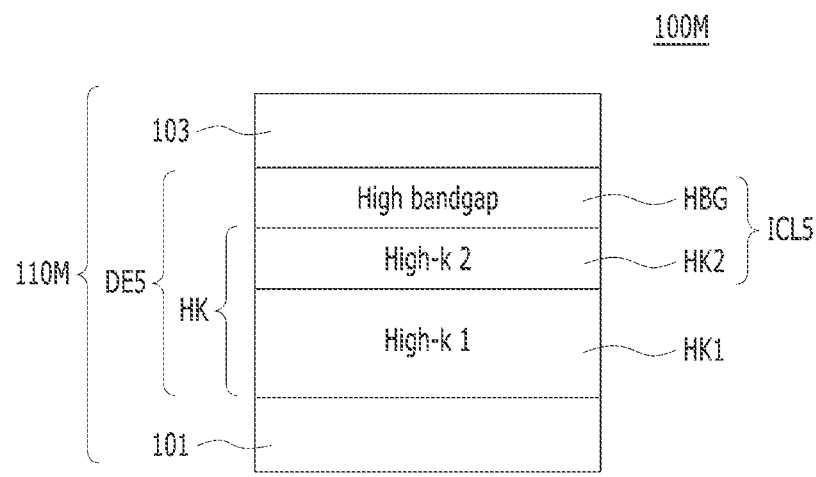
FIGS. 9A and 9B are cross-sectional views of a semiconductor device in accordance with an embodiment.
Figure 9B:
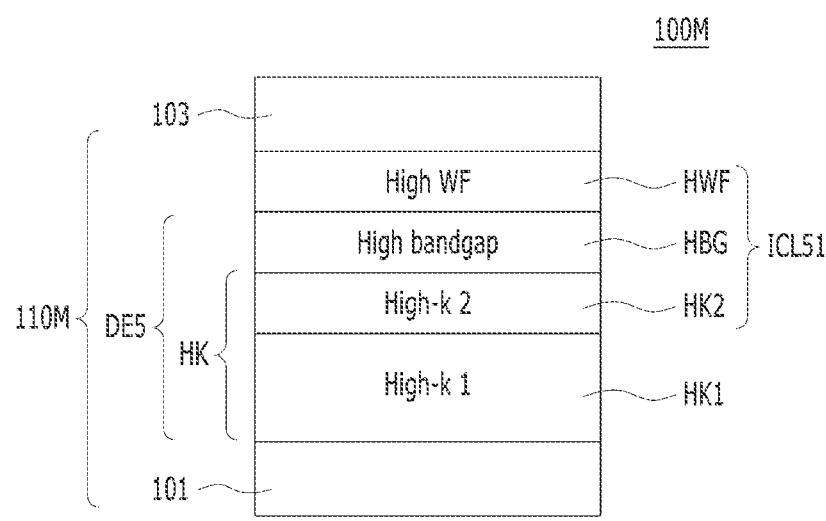

FIGS. 9A and 9B are cross-sectional views of a semiconductor device 100M in accordance with an embodiment. Detailed descriptions of the components and configurations of the semiconductor device 100M that are the same as or similar to those of the semiconductor devices 100, 120, 130 and 140 shown in FIGS. 1, 3, and 7 respectively are omitted.

Referring to FIG. 9A, the semiconductor device 100M may include a semiconductor layer stack 110M. The semiconductor layer stack 110M may include a first conductive layer 101, a dielectric layer stack DE5, and a second conductive layer 103. The dielectric layer stack DE5 may include a dielectric layer HK and an interface control layer ICL5. The dielectric layer HK may include a first high-k layer HK1 and a second high-k layer HK2. The interface control layer ICL5 may include a high bandgap layer HBG, and may further include the second high-k layer HK2. The second high-k layer HK2 may be a portion of the dielectric layer HK and a portion of the interface control layer ICL5.

Referring to FIG. 9B, an interface control layer ICL51 may include the second high-k layer HK2 and the high bandgap layer HBG, and may further include a high work function layer HWF. The second high-k layer HK2 may be a portion of the dielectric layer HK and a portion of the interface control layer ICL51.

In FIGS. 9A and 9B, the first high-k layer HK1 may have a higher dielectric constant than a silicon oxide ($SiO_2$). The first high-k layer HK1 may have a dielectric constant of approximately 4 or higher. The first high-k layer HK1 may be a zirconium oxide-based layer. The first high-k layer HK1 may have a multi-layer structure including a zirconium oxide. The first high-k layer HK1 may include a ZA ($ZrO_2$/$Al_2O_3$) structure. The ZA ($ZrO_2$/$Al_2O_3$) may be a structure in which an aluminum oxide is stacked on a zirconium oxide. In some embodiments, the first high-k layer HK1 may be a hafnium oxide-based layer. The first high-k layer HK1 may have a multi-layer structure including a hafnium oxide. For example, the first high-k layer HK1 may include a HA ($HfO_2$/$Al_2O_3$). The HA ($HfO_2$/$Al_2O_3$) may be a structure in which an aluminum oxide is stacked on a hafnium oxide.

The second high-k layer HK2 may have a higher dielectric constant than the first high-k layer HK1. The second high-k layer HK2 may have a high dielectric constant of approximately 50 or higher.

Figure 10A:
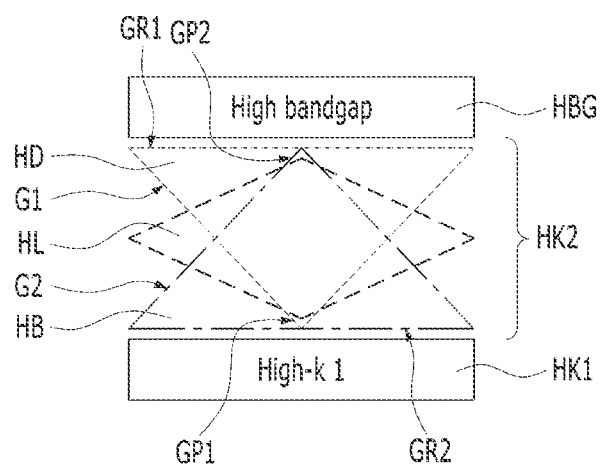
FIGS. 10A to 10C are cross-sectional views of a second high-k layer HK2.
Figure 10B:
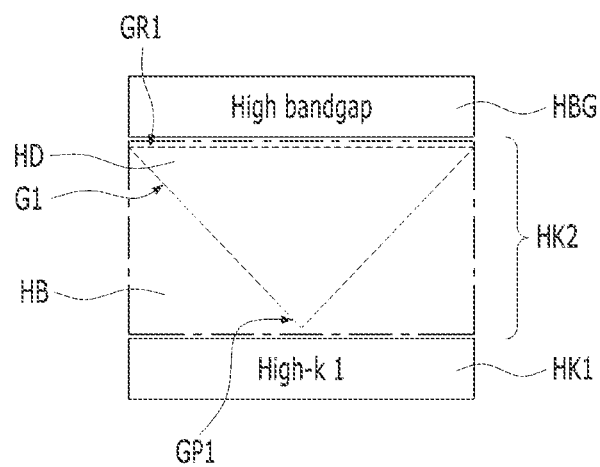
Figure 10C:
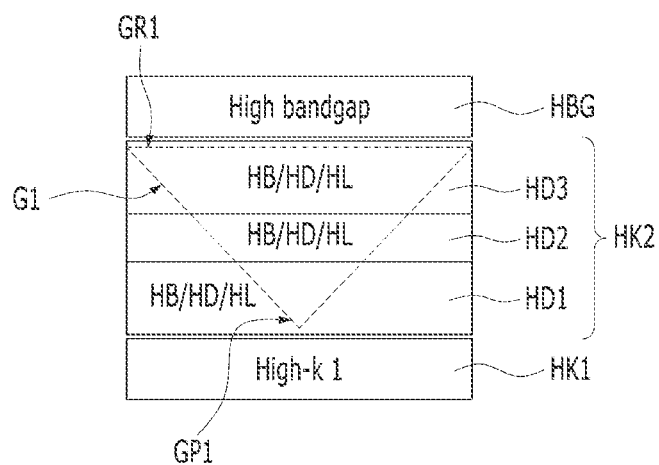

FIGS. 10A to 10C are cross-sectional views of the second high-k layer HK2.

Referring to FIG. 10A, the second high-k layer HK2 may include a base high-k material HB, a dopant material HD, and a leakage blocking material HL. The base high-k material HB, the dopant material HD and the leakage blocking material HL may be intermixed in the second high-k layer HK2. The dopant material HD may contribute to a high dielectric constant of the second high-k layer HK2. The leakage blocking material HL may serve to prevent leakage of the second high-k layer HK2. The base high-k material HB may include the same material as the first high-k layer HK1. The base high-k material HB may include a zirconium oxide or a hafnium oxide. The dopant material HD may include titanium or a titanium oxide, and the leakage blocking material HL may include aluminum or an aluminum oxide. The dielectric constant of the base high-k material HB may be increased by the dopant material HD. For example, the base high-k material HB may have a dielectric constant of approximately 40, and the dielectric constant of the base high-k material HB may be increased by the dopant material HD. In some embodiments, the second high-k layer HK2 may have a structure in which the dopant-containing layer HKD, the leakage blocking layer HLK and the uppermost layer of the dielectric layer HK that are shown in FIG. 3 are intermixed.

The concentration of the dopant material HD may be adjusted depending on its thickness. The concentration of the dopant material HD may be graded (G1). For example, the concentration of the dopant material HD may be a dopant-poor concentration GP1 near the first high-k layer HK1, and may be a dopant-rich concentration GR1 near the high bandgap layer HBG. The concentration of the dopant material HD may increase from the dopant-poor concentration GP1 to the dopant-rich concentration GR1. This is referred to as the dopant concentration gradient (denoted by the reference symbol 'G1').

The leakage blocking material HL may be concentrated in a middle region of the second high-k layer HK2. In some embodiments, the leakage blocking material HL may have a low concentration near the high bandgap layer HBG and the first high-k layer HK1. The leakage blocking material HL may not be graded.

The concentration of the base high-k material HB may be adjusted depending on its thickness. The concentration of the base high-k material HB may be graded (G2). For example, the concentration of the base high-k material HB may be a poor concentration GP2 near the high bandgap layer HBG, and may be a rich concentration GR2 near the first high-k layer HK1. The concentration of the base high-k material HB may decrease from the rich concentration GR2 to the poor concentration GP2.

In some embodiments, the dopant material HD, the leakage blocking material HL and the base high-k material HB may have uniform concentrations in the second high-k layer HK2.

As shown in FIG. 10B, the second high-k layer HK2 may include the dopant material HD and the base high-k material HB, and may not include the leakage blocking material HL. The second high-k layer HK2 may include the base high-k material HB doped with a dopant material HD. The dopant material HD may be graded (G1) to the same dopant concentration as shown in FIG. 10A.

In some embodiments, the dopant material HD may be doped to the base high-k material HB at a uniform concentration.

In FIGS. 9A to 10B, the second high-k layer HK2 may be a single layer. For example, the second high-k layer HK2 may be a single compound layer in which the base high-k material HB, the dopant material HD and the leakage blocking material HL are intermixed. In addition, the second high-k layer HK2 may be a single compound layer in which the base high-k material HB and the dopant material HD are intermixed.

As shown in FIG. 10C, the second high-k layer HK2 may be formed by sequentially stacking a first doped layer HD1, a second doped layer HD2 and a third doped layer HD3. The first doped layer HD1, the second doped layer HD2 and the third doped layer HD3 may contain the base high-k material HB, the dopant material HD and the leakage blocking material HL, respectively. The concentration of the dopant material HD may be graded (G1) as shown in FIG. 10A. For example, the first doped layer HD1 may have the dopant-poor concentration GP1, and the third doped layer HD3 may have the dopant-rich concentration GR1. The concentration of the dopant material HD may be graded (G1) so as to increase from the first doped layer HD1 to the third doped layer HD3. The concentrations of the leakage blocking material HD and the base high-k material HB may be as shown in FIG. 10A.

In some embodiments, each of the first doped layer HD1, the second doped layer HD2 and the third doped layer HD3 may contain the base high-k material HB and the dopant material HD. Herein, the second doped layer HD2 may contain the leakage blocking material HL, and the first doped layer HD1 and the third doped layer HD3 may not contain the leakage blocking material HL.

In some embodiments, the second high-k layer HK2 may be a single layer of a titanium-doped zirconium aluminum oxide (Ti-doped ZrAlO). The titanium-doped zirconium aluminum oxide is a compound in which a zirconium oxide and an aluminum oxide are intermixed, and may further include a titanium oxide as a dopant material. The zirconium oxide may correspond to the base high-k material HB, the aluminum oxide may correspond to the leakage blocking material HL, and the titanium oxide may correspond to the dopant material HD. In some embodiments, the second high-k layer HK2 may be a single layer of a titanium-doped hafnium aluminum oxide (Ti-doped HfAlO). The titanium-doped hafnium aluminum oxide is a compound in which a hafnium oxide and an aluminum oxide are intermixed, and may further include a titanium oxide as a dopant material.

In some embodiments, the second high-k layer HK2 may include a stacked layer of a first titanium-doped zirconium aluminum oxide (First Ti-doped ZrAlO), a second titanium-doped zirconium aluminum oxide (Second Ti-doped ZrAlO) and a third titanium-doped zirconium aluminum oxide (Third Ti-doped ZrAlO). The first titanium-doped zirconium aluminum oxide may have a titanium-poor concentration, and the third titanium-doped zirconium aluminum oxide may have a titanium-rich concentration.

In some embodiments, the second high-k layer HK2 may be formed by sequentially stacking a titanium-doped zirconium oxide (Ti-doped $ZrO_2$), an aluminum oxide ($Al_2O_3$) and a titanium oxide ($TiO_2$).

Figure 11A:
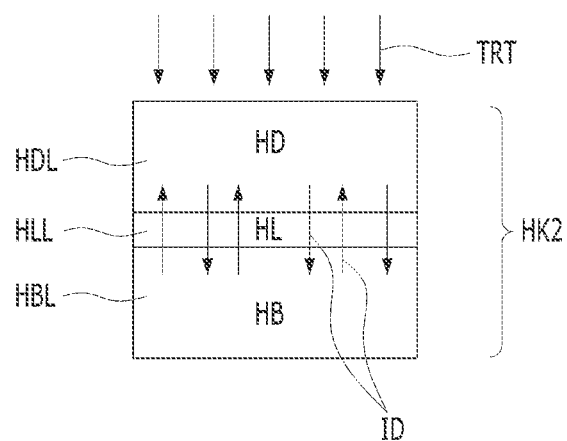
FIG. 11A is a cross-sectional view illustrating an example of a method for forming the second high-k layer HK2 in accordance with an embodiment.

FIG. 11A is a cross-sectional view illustrating an example of a method for forming the second high-k layer HK2 in accordance with an embodiment.

Referring to FIG. 11A, a base high-k material layer HBL, a leakage blocking material layer HLL and a dopant material layer HDL may be sequentially deposited. Each of the base high-k material layer HBL, the leakage blocking material layer HLL and the dopant material layer HDL may be deposited by Atomic Layer Deposition (ALD). The leakage blocking material layer HLL may be thinner than the base high-k material layer HBL and the dopant material layer HDL. The leakage blocking material layer HLL may be extremely thin. The thickness of the leakage blocking material layer HLL may be 0.1 nm to 0.2 nm.

Next, a thermal process TRT may be performed. Since the leakage blocking material layer HLL is extremely thin, inter-diffusion ID may occur between the base high-k material layer HBL and the dopant material layer HDL through the thermal process TRT. Accordingly, the second high-k layer HK2 in which the dopant material layer HDL, the leakage blocking material layer HLL and the base high-k material layer HBL are intermixed may be formed.

The concentrations of the dopant material HD, the leakage blocking material HL and the base high-k material HB may be uniform in the second high-k layer HK2 or may be the same as those shown in FIG. 10A.

When a compound of the dopant material HD and the base high-k material HB is formed, the dopant material HD may increase the dielectric constant of the base high-k material HB. The leakage blocking material HL may serve as a barrier for preventing leakage of the base high-k material HB and suppressing excessive diffusion of the dopant material HD.

Figure 11B:
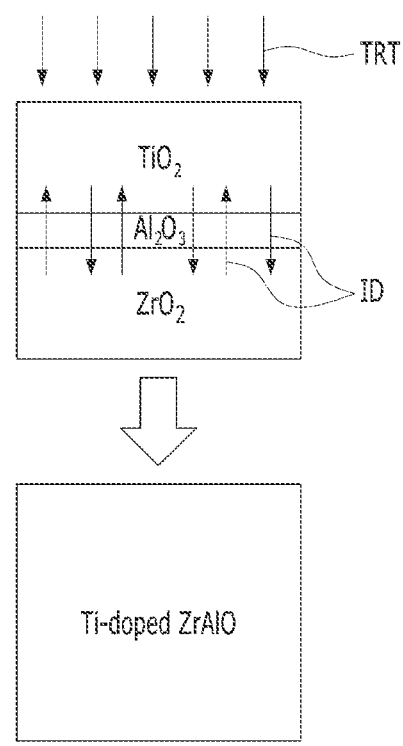
FIG. 11B is a cross-sectional view illustrating another example of a method for forming the second high-k layer HK2 in accordance with an embodiment.

FIG. 11B is a cross-sectional view illustrating another example of a method for forming the second high-k layer HK2 in accordance with an embodiment.

Referring to FIG. 11B, a zirconium oxide $ZrO_2$, an aluminum oxide $Al_2O_3$ and a titanium oxide $TiO_2$ may be sequentially deposited. Each of the zirconium oxide $ZrO_2$, the aluminum oxide $Al_2O_3$ and the titanium oxide $TiO_2$ may be deposited by Atomic Layer Deposition (ALD). The aluminum oxide $Al_2O_3$ may be thinner than the zirconium oxide $ZrO_2$ and the titanium oxide $TiO_2$. The aluminum oxide $Al_2O_3$ may be extremely thin. The thickness of the aluminum oxide $Al_2O_3$ may be 0.1 nm to 0.2 nm.

Next, a thermal process TRT may be performed. Since the aluminum oxide $Al_2O_3$ is extremely thin, inter-diffusion ID may occur between the zirconium oxide $ZrO_2$ and the titanium oxide $TiO_2$ through the thermal process TRT. Accordingly, a titanium-doped zirconium aluminum oxide (Ti-doped ZrAlO) may be formed.

As another example of the method for forming the second high-k layer HK2, the base high-k material layer HBL may be deposited by the ALD so as to contain the dopant material HD and the leakage blocking material HL. In this case, the concentrations of the dopant material HD, the leakage blocking material HL and the base high-k material HB may be uniform or may be the same as those shown in FIG. 10A.

As an example of the method for forming the second high-k layer HK2 as shown in FIG. 10C, a first base high-k material layer, a second base high-k material layer and a third base high-k material layer may be sequentially deposited by the ALD. The second base high-k material layer may be extremely thin. Each of the first base high-k material layer, the second base high-k material layer and the third base high-k material layer may contain the dopant material HD and the leakage blocking material HL. The first base high-k material layer may have a dopant-poor concentration, and the third base high-k material layer may have a dopant-rich concentration. The concentration of the dopant material HD may be graded to increase from the first base high-k material layer to the third base high-k material layer. The second base high-k material layer may have the highest concentration of the leakage blocking material HL. The second base high-k material layer may be thinner than the first and third base high-k material layers. The first base high-k material layer may have the highest concentration of the base high-k material HB. The concentration of the base high-k material HB may be graded to decrease from the first base high-k material layer to the third base high-k material layer.

Figure 12A:
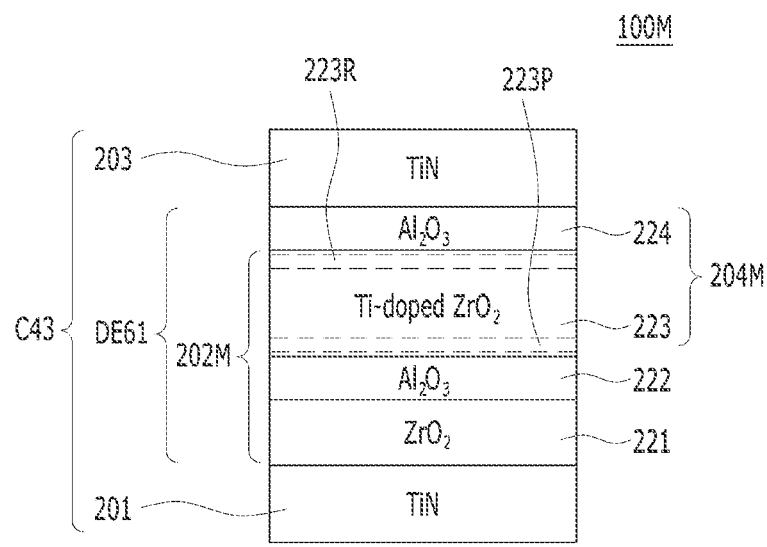
FIGS. 12A and 12B are cross-sectional views illustrating application examples of the semiconductor device shown in FIG. 9A.
Figure 12B:
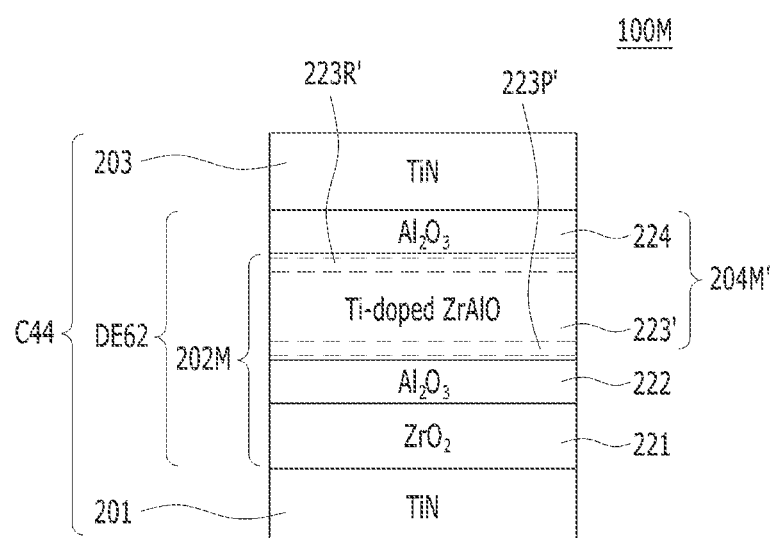

FIGS. 12A and 12B are cross-sectional views illustrating application examples of the semiconductor device 100M shown in FIG. 9A.

Referring to FIG. 12A, the semiconductor device 100M may include a capacitor C43. The capacitor C43 may correspond to the semiconductor layer stack 110M shown in FIG. 9A.

The capacitor C43 may include a bottom electrode 201, a dielectric layer 202M, and a top electrode 203. The capacitor C43 may further include an interface control layer 204M formed between the dielectric layer 202M and the top electrode 203. The stacked structure of the dielectric layer 202M and the interface control layer 204M may be a dielectric layer stack DE61.

Each of the bottom electrode 201 and the top electrode 203 may include a titanium nitride TiN. In some embodiments, the bottom electrode 201 and the top electrode 203 may include a conductive metal oxide, a metal nitride, a metal or any combinations thereof.

The dielectric layer 202M may be formed by sequentially stacking a zirconium oxide 221 and an aluminum oxide 222. In other words, the dielectric layer 202M may include a ZA (ZrO₂/Al₂O₃) structure. The aluminum oxide 222 may be thinner than the zirconium oxide 221. The dielectric layer 202M may correspond to the first high-k layer HK1 shown in FIG. 9A.

The interface control layer 204M may be formed by sequentially stacking a titanium-doped zirconium oxide 223 and an aluminum oxide 224. The aluminum oxide 224 may be thinner than the titanium-doped zirconium oxide 223. The titanium-doped zirconium oxide 223 may correspond to the second high-k layer HK2 shown in FIG. 9A. The aluminum oxide 224 may correspond to the high bandgap layer HBG shown in FIG. 9A. A zirconium oxide of the titanium-doped zirconium oxide 223 may correspond to the base high-k material HB, and titanium of the titanium-doped zirconium oxide 223 may correspond to the dopant material HD.

The dielectric layer stack DE61 may be formed by sequentially stacking the zirconium oxide 221, the aluminum oxide 222, the titanium-doped zirconium oxide 223 and the aluminum oxide 224.

The titanium-doped zirconium oxide 223 may have the dopant concentration as illustrated in FIG. 10B. For example, the titanium-doped zirconium oxide 223 may include a titanium-rich doped portion 223R and a titanium-poor doped portion 223P. The titanium-rich doped portion 223R may be in contact with the aluminum oxide 224, and the titanium-poor doped portion 223P may be in contact with the aluminum oxide 222. The titanium-rich doped portion 223R may be a titanium-rich doped zirconium oxide. The titanium-poor doped portion 223P may be a titanium-poor doped zirconium oxide.

The titanium-doped zirconium oxide 223 may be formed by intermixing a zirconium oxide and a titanium oxide. As another example, the titanium-doped zirconium oxide 223 may be formed by doping titanium during deposition of a zirconium oxide.

Referring to FIG. 12B, the remaining configurations of a capacitor C44 except for an interface control layer 204M' may be the same as those of the capacitor C43 shown in FIG. 12A.

The interface control layer 204M' may be formed by sequentially stacking a titanium-doped zirconium aluminum oxide 223' and an aluminum oxide 224. The aluminum oxide 224 may be thinner than the titanium-doped zirconium aluminum oxide 223'. The titanium-doped zirconium aluminum oxide 223' may correspond to the second high-k layer HK2 shown in FIG. 9A. The aluminum oxide 224 may correspond to the high bandgap layer HBG shown in FIG. 9A. A zirconium oxide of the titanium-doped zirconium aluminum oxide 223' may correspond to the base high-k material HB, titanium of the titanium-doped zirconium aluminum oxide 223' may correspond to the dopant material HD, and aluminum of the titanium-doped zirconium aluminum oxide 223' may correspond to the leakage blocking material HL.

A dielectric layer stack DE62 may be formed by sequentially stacking a zirconium oxide 221, an aluminum oxide 222, the titanium-doped zirconium aluminum oxide 223' and the aluminum oxide 224.

The titanium-doped zirconium aluminum oxide 223' may have any one of the dopant concentrations illustrated in FIGS. 10A and 10C. For example, the titanium-doped zirconium aluminum oxide 223' may include a titanium-rich doped portion 223R' and a titanium-poor doped portion 223P'. The titanium-rich doped portion 223R' may be in contact with the aluminum oxide 224, and the titanium-poor doped portion 223P' may be in contact with the aluminum oxide 222. The titanium-rich doped portion 223R' may be a titanium-rich doped zirconium aluminum oxide. The titanium-poor doped portion 223P' may be a titanium-poor doped zirconium aluminum oxide.

The titanium-doped zirconium aluminum oxide 223' may be formed by intermixing a zirconium oxide, an aluminum oxide and a titanium oxide. As another example, the titanium-doped zirconium aluminum oxide 223' may be formed by doping titanium and aluminum during deposition of a zirconium oxide.

FIGS. 13A to 13D are cross-sectional views illustrating various modified examples of the interface control layer ICL5 shown in FIG. 9A.

Figure 13A:
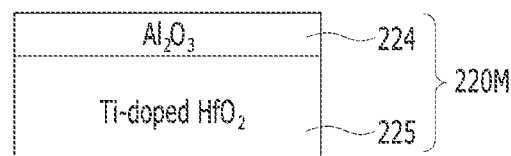
FIGS. 13A to 13D are cross-sectional views illustrating various modified examples of an interface control layer shown in FIG. 9A.

Referring to FIG. 13A, an interface control layer 220M may include a stacked layer of a titanium-doped hafnium oxide 225 and an aluminum oxide 224.

Figure 13B:
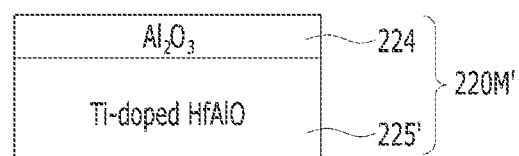

Referring to FIG. 13B, an interface control layer 220M' may include a stacked layer of a titanium-doped hafnium aluminum oxide 225' and an aluminum oxide 224.

Figure 13C:
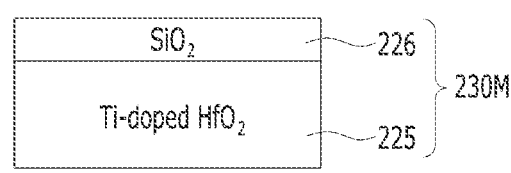

Referring to FIG. 13C, an interface control layer 230M may include a stacked layer of a titanium-doped hafnium oxide 225 and a silicon oxide 226.

Figure 13D:
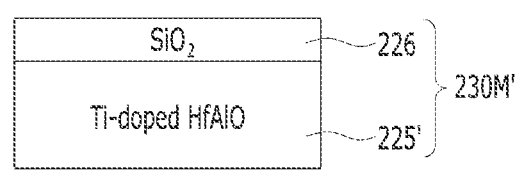

Referring to FIG. 13D, an interface control layer 230M' may include a stacked layer of a titanium-doped hafnium aluminum oxide 225' and a silicon oxide 226.

In FIGS. 13A to 13D, the titanium-doped hafnium oxide 225 and the titanium-doped hafnium aluminum oxide 225' may correspond to the second high-k layer HK2 shown in FIG. 9A. The aluminum oxide 224 and the silicon oxide 226 may correspond to the high bandgap layer HBG shown in FIG. 9A.

FIGS. 14A to 14D are cross-sectional views illustrating various modified examples of the interface control layer ICL51 shown in FIG. 9B.

Figure 14A:
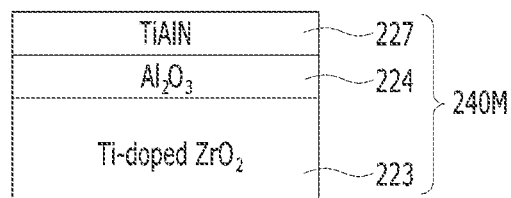
FIGS. 14A to 14D are cross-sectional views illustrating various modified examples of an interface control layer shown in FIG. 9B.

Referring to FIG. 14A, an interface control layer 240M may include a stacked layer of a titanium-doped zirconium oxide 223, an aluminum oxide 224 and a titanium aluminum nitride 227.

Figure 14B:
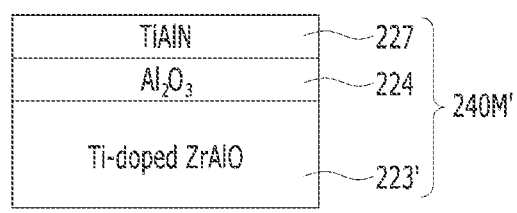

Referring to FIG. 14B, an interface control layer 240M' may include a stacked layer of a titanium-doped zirconium aluminum oxide 223', an aluminum oxide 224 and a titanium aluminum nitride 227.

Figure 14C:
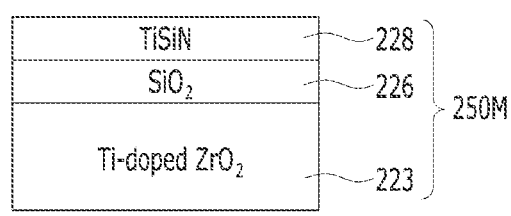

Referring to FIG. 14C, an interface control layer 250M may include a stacked layer of a titanium-doped zirconium oxide 223, a silicon oxide 226 and a titanium silicon nitride 228.

Figure 14D:
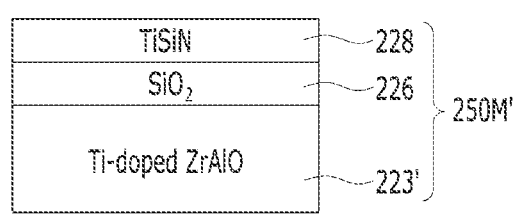

Referring to FIG. 14D, an interface control layer 250M' may include a stacked layer of a titanium-doped zirconium aluminum oxide 223', a silicon oxide 226 and a titanium silicon nitride 228.

In FIGS. 14A to 14D, the titanium-doped zirconium oxide 223 and the titanium-doped zirconium aluminum oxide 223' may correspond to the second high-k layer HK2 shown in FIG. 9B. The aluminum oxide 224 and the silicon oxide 226 may correspond to the high bandgap layer HBG shown in FIG. 9B. The titanium aluminum nitride 227 and the titanium silicon nitride 228 may correspond to the high work function layer HWF shown in FIG. 9B.

FIGS. 15A to 15D are cross-sectional views illustrating various modified examples of the interface control layer ICL51 shown in FIG. 9B.

Figure 15A:
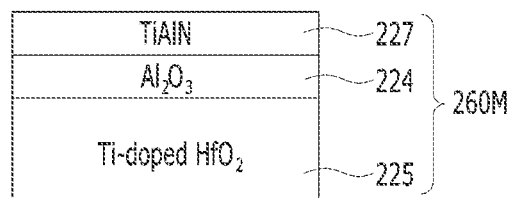
FIGS. 15A to 15D are cross-sectional views illustrating various modified examples of an interface control layer shown in FIG. 9B.

Referring to FIG. 15A, an interface control layer 260M may include a stacked layer of a titanium-doped hafnium oxide 225, an aluminum oxide 224 and a titanium aluminum nitride 227.

Figure 15B:
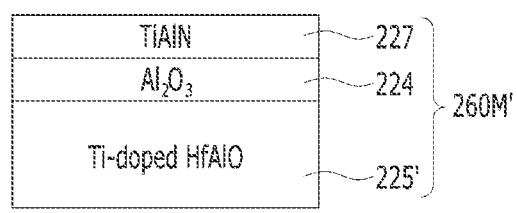

Referring to FIG. 15B, an interface control layer 260M' may include a stacked layer of a titanium-doped hafnium aluminum oxide 225', an aluminum oxide 224 and a titanium aluminum nitride 227.

Figure 15C:
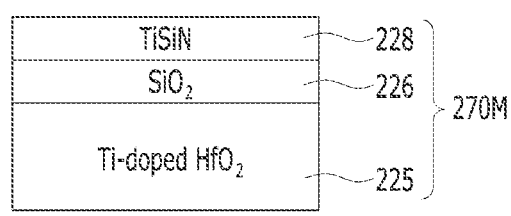

Referring to FIG. 15C, an interface control layer 270M may include a stacked layer of a titanium-doped hafnium oxide 225, a silicon oxide 226 and a titanium silicon nitride 228.

Figure 15D:
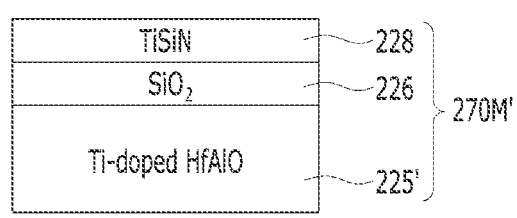

Referring to FIG. 15D, an interface control layer 270M' may include a stacked layer of a titanium-doped hafnium aluminum oxide 225', a silicon oxide 226 and a titanium silicon nitride 228.

In FIGS. 15A to 15D, the titanium-doped hafnium oxide 225 and the titanium-doped hafnium aluminum oxide 225' may correspond to the second high-k layer HK2 shown in FIG. 9B. The aluminum oxide 224 and the silicon oxide 226 may correspond to the high bandgap layer HBG shown in FIG. 9B. The titanium aluminum nitride 227 and the titanium silicon nitride 228 may correspond to the high work function layer HWF shown in FIG. 9B.

Figure 16A:
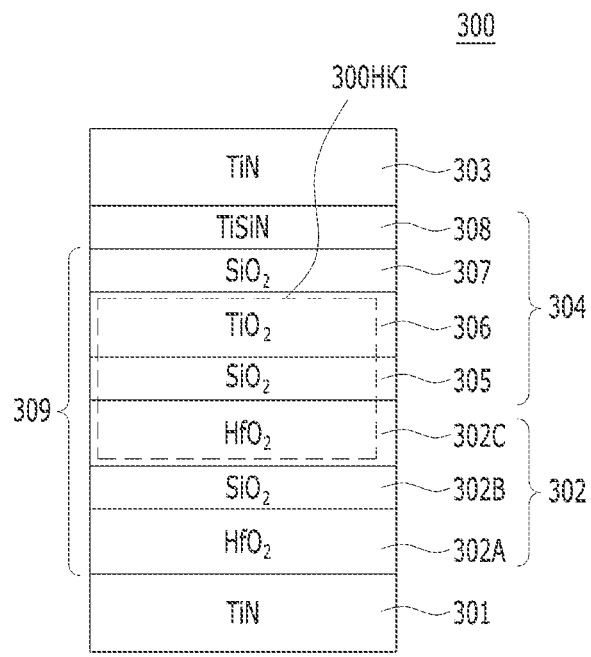
FIGS. 16A and 16B are cross-sectional views illustrating application examples of a capacitor.
Figure 16B:
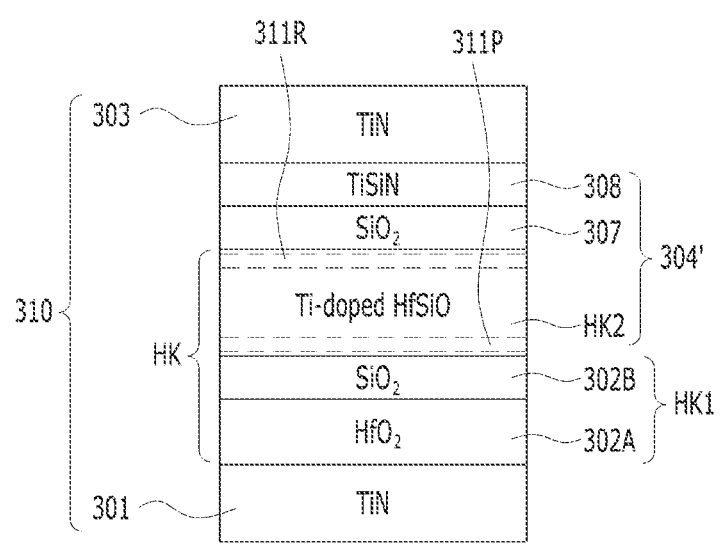

FIGS. 16A and 16B are cross-sectional views illustrating application examples of a capacitor 300.

Referring to FIG. 16A, the capacitor 300 may include a bottom electrode 301, a dielectric layer 302, and a top electrode 303. The capacitor 300 may further include an interface control layer 304 between the dielectric layer 302 and the top electrode 303. The dielectric layer 302 and a portion of the interface control layer 304 may be a dielectric layer stack 309.

Each of the bottom electrode 301 and the top electrode 303 may include a titanium nitride (TiN). In some embodiments, the bottom electrode 301 and the top electrode 303 may include a conductive metal oxide, a metal nitride, a metal or any combinations thereof.

The dielectric layer 302 may include an HSH ($HfO_2/SiO_2/HfO_2$) structure in which a hafnium oxide 302A, a silicon oxide 302B and a hafnium oxide 302C are sequentially stacked. The silicon oxide 302B may be thinner than the hafnium oxides 302A and 302C.

The interface control layer 304 may include an STS ($SiO_2/TiO_2/SiO_2$) in which a silicon oxide 305, a titanium oxide 306 and a silicon oxide 307 are sequentially stacked. The silicon oxides 305 and 307 may be thinner than the titanium oxide 306. The silicon oxide 305 may correspond to the leakage blocking layer HLK. The titanium oxide 306 may correspond to the dopant-containing layer HKD. The silicon oxide 307 may correspond to the high bandgap layer HBG.

The interface control layer 304 may further include a titanium silicon nitride (TiSiN) 308 between the silicon oxide 307 and the top electrode 303. The titanium silicon nitride 308 may correspond to the high work function layer HWF. The titanium silicon nitride 308 may be formed by intermixing the silicon oxide 307 and the top electrode 303.

The stacked structure in which the hafnium oxide 302A, the silicon oxide 302B, the hafnium oxide 302C, the silicon oxide 305, the titanium oxide 306 and the silicon oxide 307 are sequentially stacked may be a HSHSTS ($HfO_2/SiO_2/HfO_2/SiO_2/TiO_2/SiO_2$) structure.

In some embodiments, since the silicon oxide 305, which is thin, is disposed between the titanium oxide 306 and the hafnium oxide 302C, the titanium oxide 306, the hafnium oxide 302C and the silicon oxide 305 may be intermixed. For example, titanium of the titanium oxide 306 may be diffused into the hafnium oxide 302C and the silicon oxide 305. The titanium oxide 306, the hafnium oxide 302C and the silicon oxide 305 may be intermixed to form a titanium-doped hafnium silicon oxide (Ti-doped HfSiO) 300HKI. The titanium-doped hafnium silicon oxide 300HKI may have a higher dielectric constant than the hafnium oxide 302C. The doping amount of the titanium may be controlled by the thickness of the titanium oxide 306. The titanium-doped hafnium silicon oxide 300HKI may correspond to the second high-k layer HK2 shown in FIG. 9A. The hafnium oxide 302A and the silicon oxide 302B may correspond to the first high-k layer HK1 shown in FIG. 9A.

Referring to FIG. 16B, a capacitor 310 may include a dielectric layer HK and an interface control layer 304'. The dielectric layer HK may include a first high-k layer HK1 and a second high-k layer HK2. The interface control layer 304' may include a silicon oxide 307 and a titanium silicon nitride 308, and may further include the second high-k layer HK2. The second high-k layer HK2 may be a portion of the dielectric layer HK and a portion of the interface control layer 304'.

The first high-k layer HK1 may include the stacked structure of a hafnium oxide 302A and a silicon oxide 302B. The second high-k layer HK2 may include a titanium-doped hafnium silicon oxide (Ti-doped HfSiO). The titanium-doped hafnium silicon oxide may include a titanium-rich doped portion 311R and a titanium-poor doped portion 311P. The titanium-rich doped portion 311R may be in contact with the silicon oxide 307, and the titanium-poor doped portion 311P may be in contact with the silicon oxide 302B. The titanium-rich doped portion 311R may be a titanium-rich doped hafnium silicon oxide. The titanium-poor doped portion 311P may be a titanium-poor doped hafnium silicon oxide.

TABLE 1

|  | $Al_2O_3$ omitted | Thin $TiO_2$ | Thick $TiO_2$ | $TiO_2$ omitted |
|---|---|---|---|---|
| Dielectric layer stack | ZAZAT(ZAZA/ TiO2) | ZAZAT1A | ZAZAT2A | ZAZAA |
| $TiO_2$ cycle | 20 | 15 | 20 | 0 |
| $Al_2O_3$ cycle | 0 | 1 | 1 | 1 |
| Cs | 6.02 | 6.32 | 6.45 | 5.97 |
| pLKG | 0.15 | 0.2 | 0.21 | 0.6 |
| nLKG | −0.03 | −0.04 | −0.04 | −0.17 |
| pBV | 3.07 | 3.16 | 3.13 | 2.97 |
| nBV | −2.88 | −2.8 | −2.83 | −2.43 |
| EOT | 5.40 | 5.14 | 5.04 | 5.45 |

Table 1 shows values obtained by comparing characteristics of a dielectric layer depending on the thickness of a titanium oxide. The values shown in Table 1 are obtained by comparing capacitance Cs, leakage currents pLKG and nLKG and breakdown voltages pBV and nBV depending on different types of the dielectric layer stack.

In Table 1, 'TiO$_2$ cycle' refers to the number of TiO$_2$ ALD cycles, and 'Al$_2$O$_3$ cycle' refers to the number of Al$_2$O$_3$ ALD cycles. 'Cs' refers to entire capacitance. 'pLKG' and 'nLKG' refer to a positive bias leakage current density and a negative bias leakage current density, respectively. 'pBV' and 'nBV' refer to a positive bias breakdown voltage and a negative bias breakdown voltage, respectively.

ZAZAT (ZrO$_2$/Al$_2$O$_3$/ZrO$_2$/Al$_2$O$_3$/TiO$_2$), ZAZAT1A (ZrO$_2$/Al$_2$O$_3$/ZrO$_2$/Al$_2$O$_3$/Thin TiO$_2$/Al$_2$O$_3$), ZAZAT2A (ZrO$_2$/Al$_2$O$_3$/ZrO$_2$/Al$_2$O$_3$/Thick TiO$_2$/Al$_2$O$_3$) and ZAZAA (ZrO$_2$/Al$_2$O$_3$/ZrO$_2$/Al$_2$O$_3$/Al$_2$O$_3$) stacks are provided as the dielectric layer stack.

Referring to Table 1, in case of the ZAZAT2A stack in which the thickness of the titanium oxide is increased, it may be seen that the equivalent oxide layer thickness (EOT) and the leakage currents (LKG) are decreased.

As a comparative example, in case of the ZAZAA stack in which the titanium oxide is omitted, it may be seen that the equivalent oxide layer thickness (EOT), the leakage currents (LKG) and the breakdown voltages (BV) deteriorate.

In case of the ZAZAT, ZAZAT1A and ZAZAT2A stacks in which the titanium oxide is formed, it may be seen that the entire capacitance is relatively further increased in comparison with the ZAZAA stack.

Figure 17A:
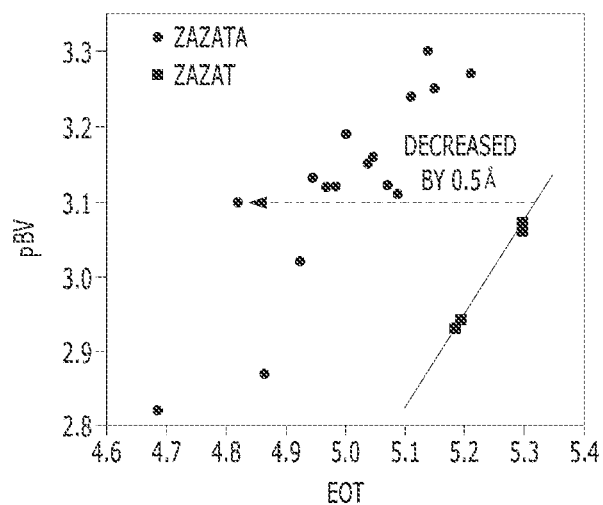
FIGS. 17A and 17B are graphs for describing an effect of improving electrical characteristics of a dielectric layer stack.
Figure 17B:
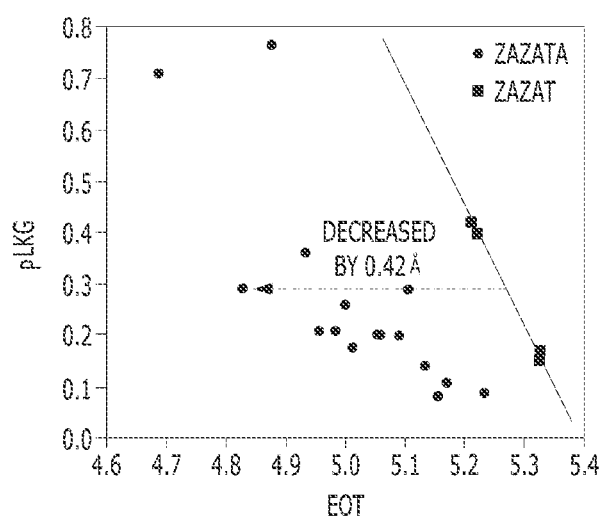

FIGS. 17A and 17B are graphs for describing an effect of improving electrical characteristics of the dielectric layer stack. FIG. 17A is a graph of the breakdown voltage pBV against the equivalent oxide layer thickness (EOT). FIG. 17B is a graph of the leakage current pLKG against the equivalent oxide layer thickness (EOT).

Referring to FIGS. 17A and 17B, the ZAZATA stack has excellent characteristics in terms of the breakdown voltages BV and the leakage currents LKG as well as the equivalent oxide layer thickness (EOT). Quantitatively, it is possible to decrease the equivalent oxide layer thickness (EOT) by approximately 0.5 Å at the same breakdown voltage (pBV) in comparison with the ZAZAT stack. Quantitatively, it is possible to decrease the equivalent oxide layer thickness (EOT) by approximately 0.42 Å at the same leakage current (pLKG) in comparison with the ZAZAT stack.

FIGS. 18A to 18E are cross-sectional views illustrating a method for fabricating a semiconductor device in accordance with an embodiment.

Figure 18A:
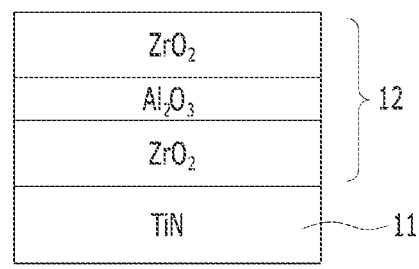
FIGS. 18A to 18E are cross-sectional views illustrating a method for fabricating a semiconductor device in accordance with an embodiment.

As shown in FIG. 18A, a dielectric layer 12 may be formed on a bottom electrode 11. The bottom electrode 11 may include a metal, a metal nitride, a conductive metal oxide or any combinations thereof. The bottom electrode 11 may include titanium (TI), a titanium nitride (TiN), a tantalum nitride (TaN), tungsten (W), a tungsten nitride (WN), ruthenium (Ru), iridium (Ir), a ruthenium oxide, an iridium oxide or any combinations thereof. According to an embodiment, the bottom electrode 11 may include a titanium nitride (TiN). The bottom electrode 11 may be formed by Atomic Layer Deposition (ALD). Accordingly, the bottom electrode 11 may include an ALD TiN. The ALD TiN may be deposited by using a titanium-source material and a nitrogen-source material. The titanium-source material may include TiCl$_4$, and the nitrogen-source material may include NH$_3$.

The dielectric layer 12 may include a zirconium oxide-based layer. The dielectric layer 12 may include a zirconium oxide. The dielectric layer 12 may include a ZA stack of a zirconium oxide and an aluminum oxide or a ZAZ stack of a zirconium oxide, an aluminum oxide and a zirconium oxide. The dielectric layer 12 may be formed by ALD.

Figure 18B:
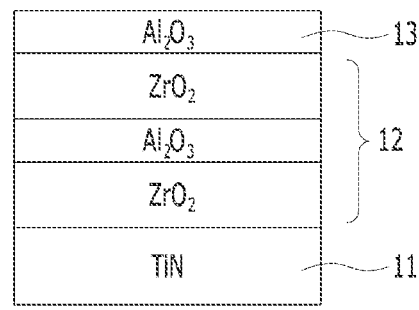

As shown in FIG. 18B, a leakage blocking layer 13 may be formed on the dielectric layer 12. The leakage blocking layer 13 may include an aluminum oxide (Al$_2$O$_3$). The leakage blocking layer 13 may be thin. The thickness of the leakage blocking layer 13 may be 0.1 nm to 0.2 nm. The leakage blocking layer 13 may be formed by ALD.

Figure 18C:
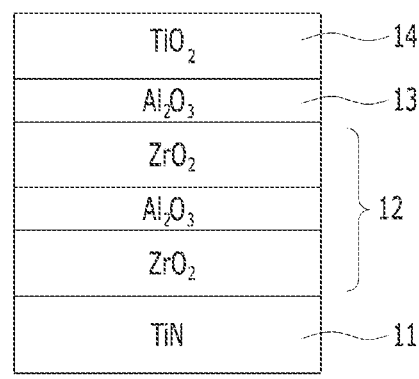

As shown in FIG. 18C, a dopant-containing layer 14 may be formed on the leakage blocking layer 13. The dopant-containing layer 14 may include a titanium oxide (TiO$_2$). The dopant-containing layer 14 may be formed by ALD.

Although not illustrated, a thermal process may be performed after the dopant-containing layer 14 is formed. Through the thermal process, the dopant-containing layer 14, the leakage blocking layer 13 and a portion of the dielectric layer 12 in contact with the leakage blocking layer 13 may be intermixed to form an intermixed compound. The intermixed compound may have a higher dielectric constant than the dielectric layer 12. The intermixed compound having a high dielectric constant may include a compound of a zirconium oxide and an aluminum oxide, and may further include a titanium oxide as a dopant.

Figure 18D:
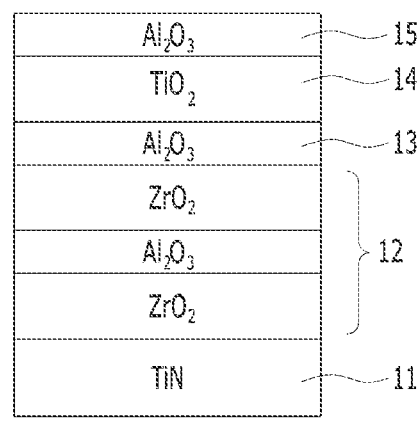

As shown in FIG. 18D, a reduction preventing layer 15 may be formed on the dopant-containing layer 14. The reduction preventing layer 15 may include a reduction preventing material. The reduction preventing layer 15 may include a high bandgap material. The reduction preventing layer 15 may include an aluminum oxide (Al$_2$O$_3$) or a silicon oxide (SiO$_2$). The thickness of the reduction preventing layer 15 may be 0.1 nm to 0.2 nm. The reduction preventing layer 15 may be formed by ALD. The reduction preventing layer 15 may correspond to the high bandgap material HBG described above according to embodiments.

The reduction preventing layer 15 and the leakage blocking layer 13 may be the same material. The leakage blocking layer 13 may include a high bandgap material.

Figure 18E:
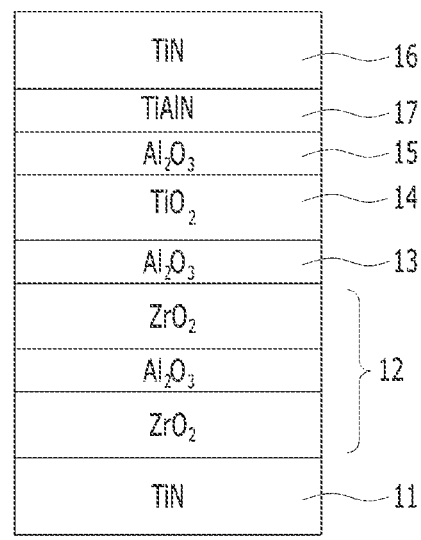

As shown in FIG. 18E, a top electrode 16 may be formed on the reduction preventing layer 15. The top electrode 16 may include a metal, a metal nitride, a conductive metal oxide or any combinations thereof. The top electrode 16 may include titanium (Ti), a titanium nitride (TiN), a tantalum nitride (TaN), tungsten (W), a tungsten nitride (WN), ruthenium (Ru), iridium (Ir), a ruthenium oxide, an iridium oxide or any combinations thereof. According to an embodiment, the top electrode 16 may include a titanium nitride. The top electrode 16 may be formed by ALD. Accordingly, the top electrode 16 may include an ALD TiN. The ALD TiN may be deposited by using a titanium-source material and a nitrogen-source material. The titanium-source material may include $TiCl_4$, and the nitrogen-source material may include $NH_3$.

While the top electrode 16 is formed, the dopant-containing layer 14 and the dielectric layer 12 may be reduced by $NH_3$ which is the nitrogen-source material. According to an embodiment, since the reduction preventing layer 15 is formed before the top electrode 16 is formed, the reductions of the dopant-containing layer 14 and the dielectric layer 12 may be prevented.

While the top electrode 16 is formed, a surface of the reduction preventing layer 15 and the top electrode 16 may be intermixed. Accordingly, a high work function layer 17 may be formed thin at an interface between the top electrode 16 and the reduction preventing layer 15. When the top electrode 16 includes a titanium nitride and the reduction preventing layer 15 includes an aluminum oxide, the high work function layer 17 may include a titanium aluminum nitride (TiAlN). In some embodiments, when the top electrode 16 includes a titanium nitride and the reduction preventing layer 15 include a silicon oxide, the high work function layer 17 may include a titanium silicon nitride (TiSiN).

Figure 19A:
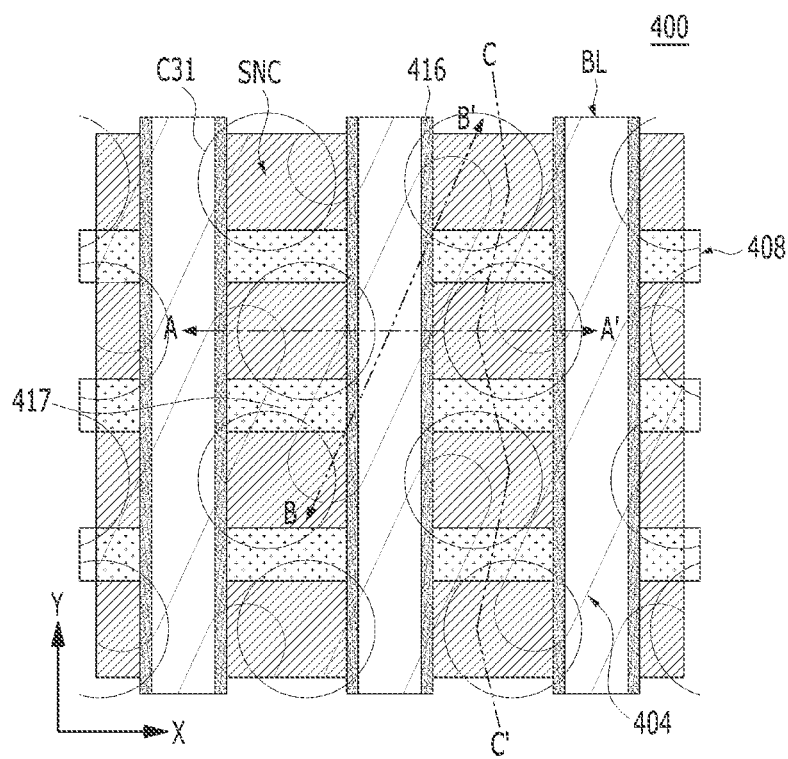
FIGS. 19A to 19C are cross-sectional views illustrating a memory cell.
Figure 19B:
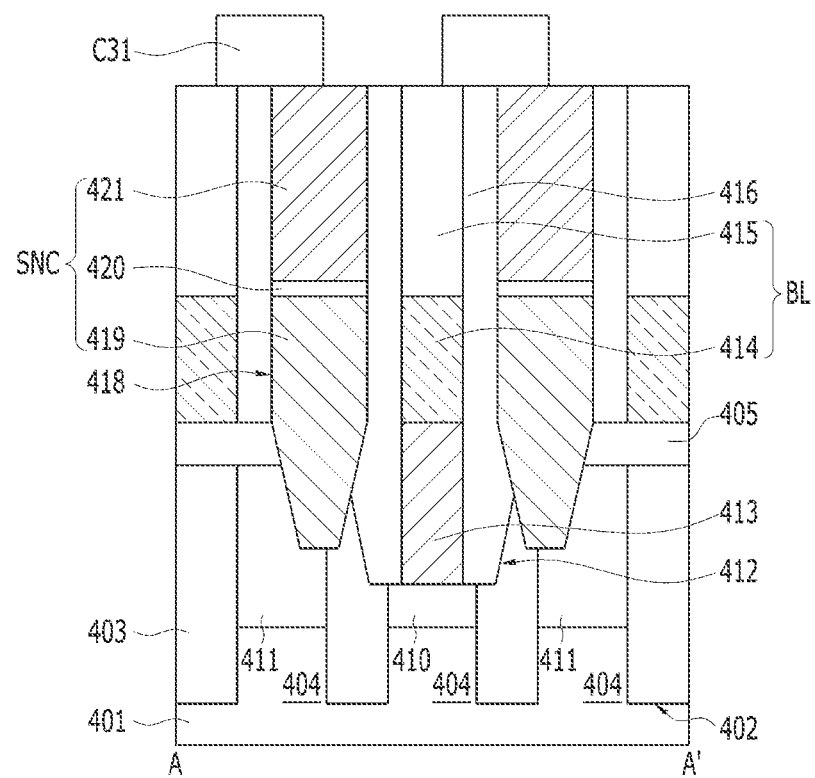
Figure 19C:
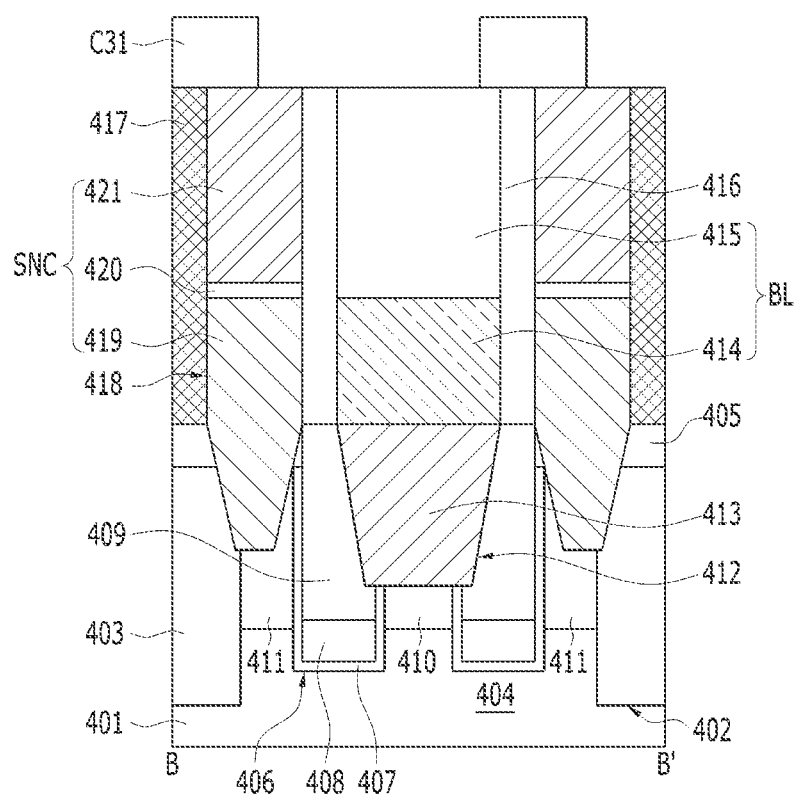

FIGS. 19A to 19C are cross-sectional views illustrating a memory cell 400. FIG. 19B is a cross-sectional view of the memory cell 400 taken along a line A-A' shown in FIG. 19A. FIG. 19C is a cross-sectional view of the memory cell 400 taken along a line B-B' shown in FIG. 19A.

The memory cell 400 may include a cell transistor including a buried word line 408, a bit line 414, and a capacitor C31. The capacitor C31 may include the capacitor C31 shown in FIG. 8A.

The memory cell 400 is described in detail.

An isolation layer 403 and an active region 404 may be formed in a substrate 401. A plurality of active regions 404 may be defined by the isolation layer 403. The substrate 401 may be formed of or include a material that is suitable for semiconductor processing. The substrate 401 may include a semiconductor substrate. The substrate 401 may be formed of a material containing silicon. The substrate 401 may include silicon, monocrystalline silicon, polysilicon, amorphous silicon, silicon germanium, monocrystalline silicon germanium, polycrystalline silicon germanium, carbon-doped silicon, any combinations thereof or multi-layers of them. The substrate 401 may include another semiconductor material, such as germanium. The substrate 401 may include an III/V-group semiconductor substrate, for example, a chemical compound semiconductor substrate such as a gallium arsenide (GaAs). The substrate 401 may include a Silicon-On-Insulator (SOI) substrate. The isolation layer 403 may be formed in an isolation trench 402 through a Shallow Trench Isolation (STI) process.

A word line trench 406 may be formed in the substrate 401. The word line trench 406 may be referred to as a gate trench. A gate dielectric layer 407 may be formed on the surface of the word line trench 406. A buried word line 408 which fills a portion of the word line trench 406 may be formed on the gate dielectric layer 407. The buried word line 408 may be referred to as a buried gate electrode. A word line capping layer 409 may be formed on the buried word line 408. The top surface of the buried word line 408 may be lower than the top surface of the substrate 401. The buried word line 408 may be a low-resistivity metal material. The buried word line 408 may be formed by sequentially stacking a titanium nitride and tungsten. In some embodiments, the buried word line 408 may be formed of a titanium nitride (TiN) only.

A first impurity region 410 and a second impurity region 411 may be formed in the substrate 401. The first and second impurity regions 410 and 411 may be spaced apart from each other by the word line trench 406. The first and second impurity regions 410 and 411 may be referred to as first and second source/drain regions, respectively. The first and second impurity regions 410 and 411 may include an N-type impurity, such as arsenic (As) and phosphorus (P). Consequently, the buried word line 408 and the first and second impurity regions 410 and 411 may become a cell transistor. The cell transistor may improve a short-channel effect due to the presence of the buried word line 408.

A bit line contact plug 413 may be formed on the substrate 401. The bit line contact plug 413 may be coupled to the first impurity region 410. The bit line contact plug 413 may be positioned inside a bit line contact hole 412. The bit line contact hole 412 may be formed in a hard mask layer 405. The hard mask layer 405 may be formed on the substrate 401. The bit line contact hole 412 may expose the first impurity region 410. The bottom surface of the bit line contact plug 413 may be lower than the top surface of the substrate 401. The bit line contact plug 413 may be formed of polysilicon or a metal material. A portion of the bit line contact plug 413 may have a narrower line width than the diameter of the bit line contact hole 412. The bit line 414 may be formed on the bit line contact plug 413. A bit line hard mask 415 may be formed on the bit line 414. The stacked structure of the bit line 414 and the bit line hard mask 415 may be referred to as a bit line structure BL. The bit line 414 may have a linear shape that is extended in a direction crossing the buried word line 408. A portion of the bit line 414 may be coupled to the bit line contact plug 413. The bit line 414 may include a metal material. The bit line hard mask 415 may include a dielectric material.

A bit line spacer 416 may be formed on the sidewall of the bit line structure BL. The bottom portion of the bit line spacer 416 may be extended to be formed on both sidewalls of the bit line contact plug 413. The bit line spacer 416 may include a silicon oxide, a silicon nitride or a combination thereof. In some embodiments, the bit line spacer 416 may include an air gap. For example, the bit line spacer 416 may have a nitride-air gap-nitride (NAN) structure in which the air gap is located between silicon nitrides.

A storage node contact plug SNC may be formed between the neighboring bit line structures BL. The storage node contact plug SNC may be formed in a storage node contact hole 418. The storage node contact hole 418 may have a high aspect ratio. The storage node contact plug SNC may be coupled to the second impurity region 411. The storage node contact plug SNC may include a bottom plug 419 and a top plug 421. The storage node contact plug SNC may further include an ohmic contact layer 420 between the bottom plug 419 and the top plug 421. The ohmic contact layer 420 may include a metal silicide. The top plug 421 may include a metal material, and the bottom plug 419 may include a silicon-containing material.

From a perspective view in parallel with the bit line structure BL, a plug isolation layer 417 may be formed between the neighboring storage node contact plugs SNC. The plug isolation layer 417 may be formed between the neighboring bit line structures BL, and may provide the storage node contact hole 418 along with the hard mask layer 405.

The capacitor C31 may be formed on the top plug 421. In some embodiments, the capacitor C31 of the memory cell 400 may be replaced by any one of the capacitors described above according to embodiments.

FIGS. 20A to 20F are cross-sectional views illustrating application examples of the capacitor C31.

Figure 20A:
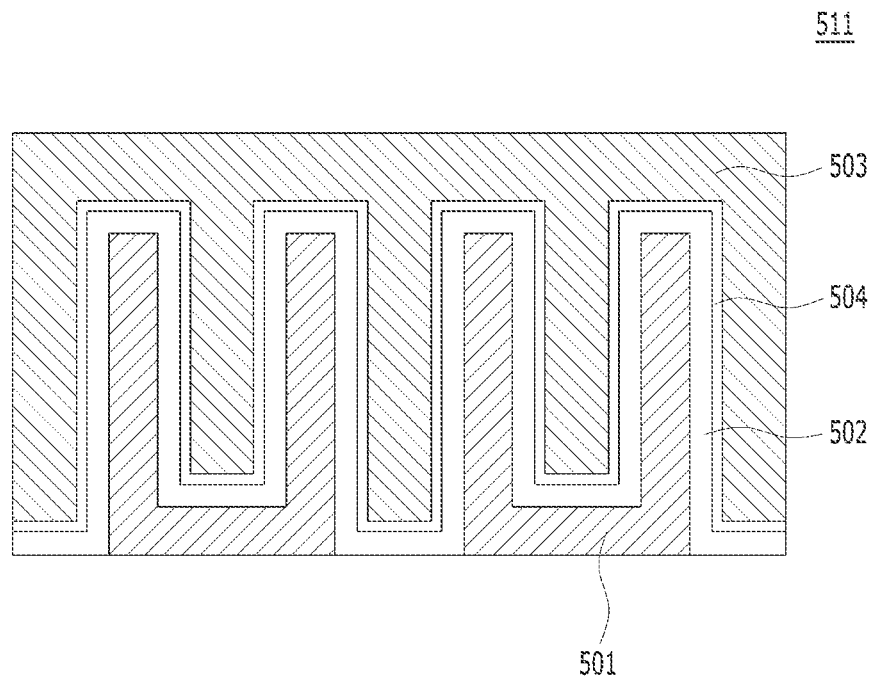
FIGS. 20A to 20F are cross-sectional views illustrating application examples of a capacitor C31 shown in FIG. 19B.

Referring to FIG. 20A, a capacitor 511 may include a bottom electrode 501, a dielectric layer 502, an interface control layer 504, and a top electrode 503. The bottom electrode 501 may be of a cylinder shape. The dielectric layer 502 may be formed on the bottom electrode 501, and the interface control layer 504 may be formed on the dielectric layer 502. The top electrode 503 may be formed on the interface control layer 504. The interface control layer 504 may correspond to any one of the interface control layers described above according to embodiments.

Hereinafter, detailed descriptions of the components and configurations of capacitors 512 to 516 that are the same as or similar to those of the capacitor 511 shown in FIG. 20A are omitted.

Figure 20B:
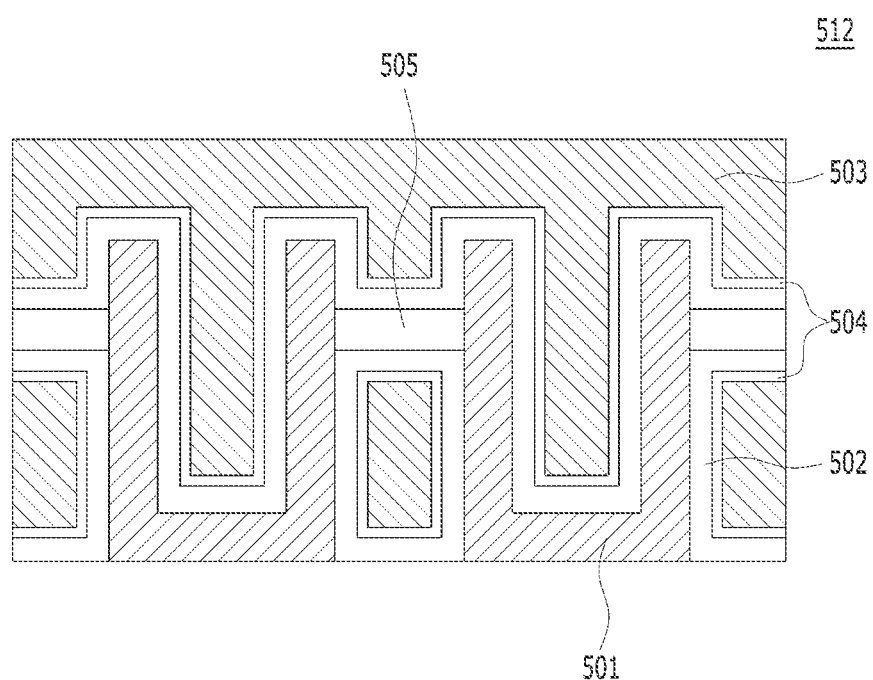

Referring to FIG. 20B, the capacitor 512 may include a bottom electrode 501 of a cylinder shape, a dielectric layer 502, an interface control layer 504, and a top electrode 503. The capacitor 512 may further include a supporter 505. A supporter 505 is a structure supporting an outer wall of the bottom electrode 501. The supporter 505 may include a silicon nitride.

Figure 20C:
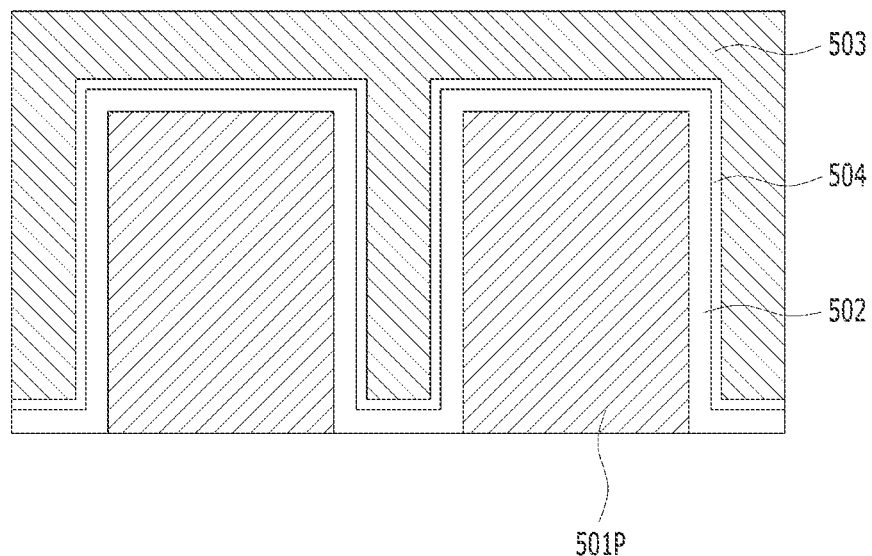
Figure 20D:
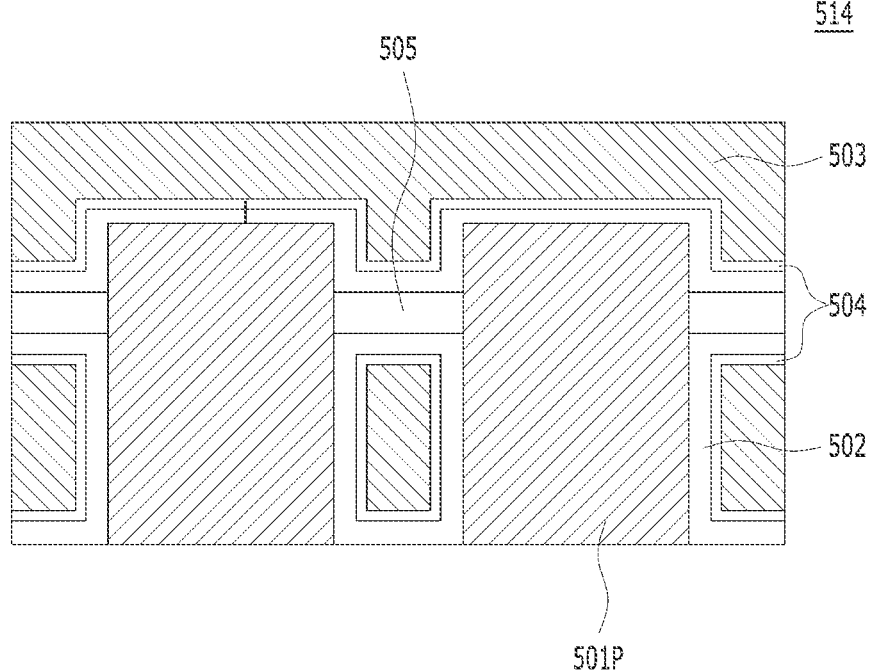

Referring to FIGS. 20C and 20D, each of the capacitors 513 and 514 may include a bottom electrode 501P of a pillar shape, a dielectric layer 502, an interface control layer 504, and a top electrode 503. The capacitor 514 shown in FIG. 20D may further include a supporter 505.

Figure 20E:
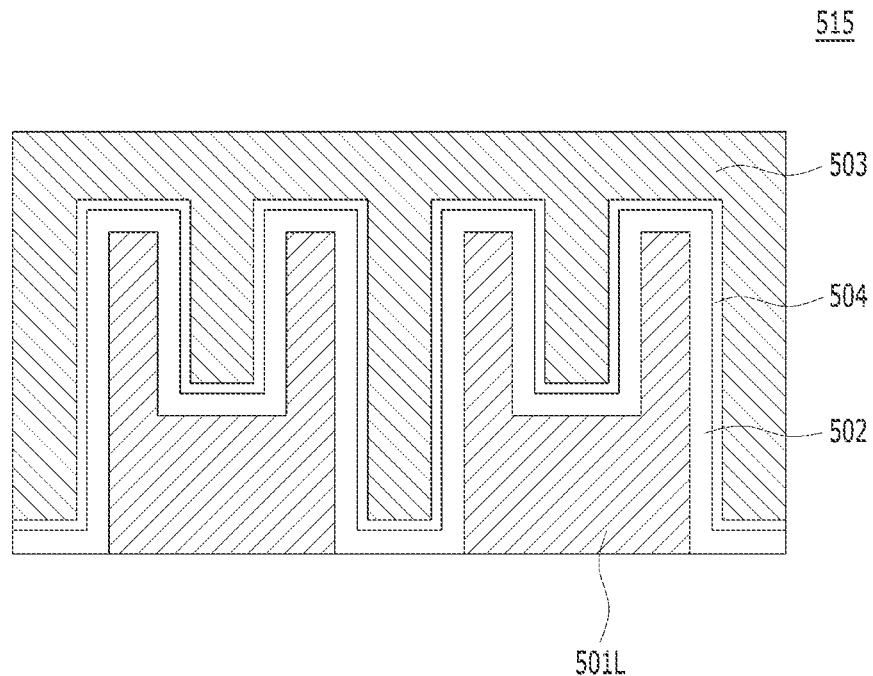
Figure 20F:
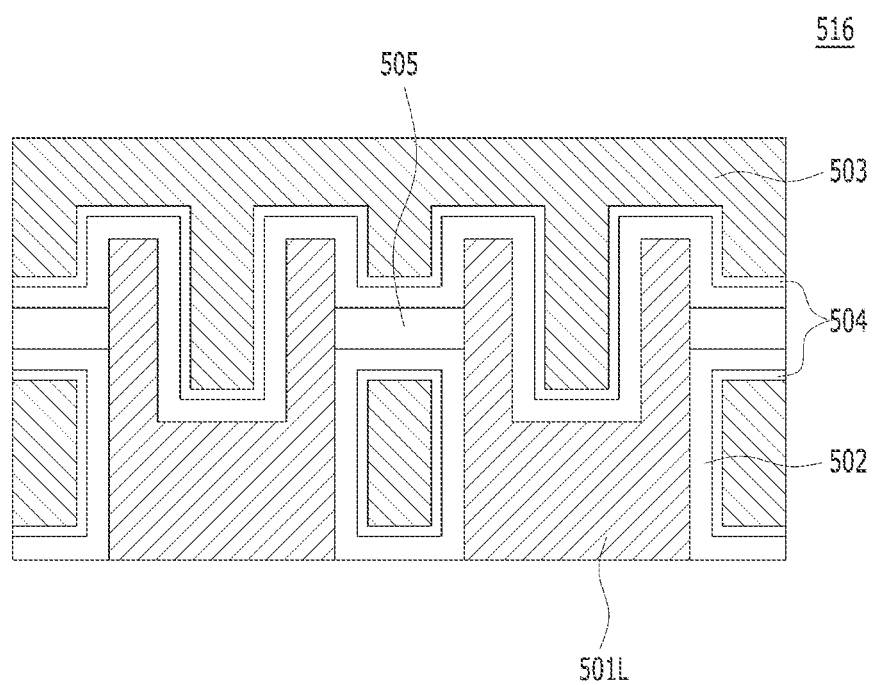

Referring to FIGS. 20E and 20F, each of the capacitors 515 and 516 may include a bottom electrode 501L of a pylinder shape (combination of pillar and cylinder), a dielectric layer 502, an interface control layer 504, and a top electrode 503. The capacitor 516 shown in FIG. 20F may further include a supporter 505. The bottom electrode 501L may include a bottom region and a top region. The bottom region of the bottom electrode 501L may be of a pillar shape, and the top region of the bottom electrode 501L may be of a cylinder shape. A hybrid structure of the pillar shape and the cylinder shape may be referred to as the pylinder shape.

As described above, the interface control layer 504 including the leakage blocking material, the dopant material, the high bandgap material and the high work function material may be formed in the process of forming the capacitors 511 to 516, thereby increasing the dielectric constant of the dielectric layer 502, reducing the equivalent oxide layer thickness of the dielectric layer 502 and preventing the leakage. Accordingly, a high-integrated dynamic random-access memory (DRAM) whose refresh characteristics and reliability are improved may be fabricated.

The semiconductor device in accordance with embodiments is not limited to the DRAM but may be applied to a memory such as a static random-access memory (SRAM), a flash memory, a ferroelectric random-access memory (FeRAM), a magnetic random-access memory (MRAM) and a phase change random access memory (PRAM).

According to the embodiments, a reduction preventing material may be formed between a dielectric layer and a conductive layer, thereby suppressing oxygen loss of the dielectric layer.

According to the embodiments, a high bandgap material and a high work function material may be formed between a dielectric layer and a conductive layer, thereby reducing a leakage.

According to the embodiments, a dopant material may be formed between a dielectric layer and a conductive layer, thereby increasing the dielectric constant of the dielectric layer.

According to the embodiments, an interface control layer including a leakage blocking material, a dopant material, a high bandgap material and a high work function material may be formed in the process of forming a capacitor, thereby increasing the dielectric constant of a dielectric layer, reducing the equivalent oxide layer thickness of the dielectric layer and preventing a leakage.

While the present disclosure has been described with respect to the specific embodiments, it should be noted that the embodiments are for describing, not limiting, the present disclosure. Further, it should be noted that the present disclosure may be achieved in various ways through substitution, change, and modification, by those skilled in the art without departing from the scope of the present invention as defined by the following claims.

What is claimed is:

1. A capacitor comprising:
a bottom electrode;
a dielectric layer formed on the bottom electrode, and including an intermixed compound in which two or more high-k materials are mixed;
a top electrode formed on the dielectric layer; and
an interface control layer formed between the dielectric layer and the top electrode, and including a reduction preventing material and a high work function material that is sequentially stacked one on the other,
wherein the reduction preventing material is formed between the dielectric layer and the top electrode, and
wherein the high work function material is formed between the reduction preventing material and the top electrode.

2. The capacitor of claim 1, wherein the intermixed compound includes a first high-k material and a second high-k material having a higher dielectric constant than the first high-k material.

3. The capacitor of claim 1, wherein the intermixed compound includes a compound of a titanium oxide and a zirconium oxide.

4. The capacitor of claim 1, wherein the intermixed compound includes a compound of an aluminum oxide and a zirconium oxide, and further includes a dopant material of a titanium oxide.

5. The capacitor of claim 1, wherein the high work function material includes a high work function compound in which the reduction preventing material and the top electrode are intermixed, and the high work function compound includes a conductive material having a higher work function than the top electrode.

6. The capacitor of claim 1, wherein the reduction preventing material includes a high bandgap material having a higher bandgap than a zirconium oxide and a hafnium oxide.

7. The capacitor of claim 1, wherein the reduction preventing material includes an aluminum oxide or a silicon oxide.

8. The capacitor of claim 1, wherein the top electrode includes a titanium nitride, the reduction preventing material includes an aluminum oxide, and the high work function material includes a titanium aluminum nitride.

9. The capacitor of claim 1, wherein the top electrode includes a titanium nitride, the reduction preventing material includes a silicon oxide, and the high work function material includes a titanium silicon nitride.

10. The capacitor of claim 1, wherein the dielectric layer further includes a high-k material layer formed between the intermixed compound and the bottom electrode and having a lower dielectric constant than the intermixed compound.

* * * * *